United States Patent
Yamazaki et al.

(10) Patent No.: US 8,951,894 B2
(45) Date of Patent: Feb. 10, 2015

(54) PLASMA TREATMENT APPARATUS, METHOD FOR FORMING FILM, AND METHOD FOR MANUFACTURING THIN FILM TRANSISTOR

(75) Inventors: Shunpei Yamazaki, Setagaya (JP); Takayuki Inoue, Isehara (JP); Erumu Kikuchi, Atsugi (JP); Hiroto Inoue, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/618,472

(22) Filed: Sep. 14, 2012

(65) Prior Publication Data
US 2013/0012006 A1 Jan. 10, 2013

Related U.S. Application Data

(62) Division of application No. 12/817,224, filed on Jun. 17, 2010, now abandoned.

(30) Foreign Application Priority Data

Jun. 19, 2009 (JP) ................. 2009-146926

(51) Int. Cl.
| | | |
|---|---|---|
| H01L 21/314 | (2006.01) | |
| H01J 37/32 | (2006.01) | |
| H01L 29/66 | (2006.01) | |

(52) U.S. Cl.
CPC ....... *H01J 37/32449* (2013.01); *H01J 37/3244* (2013.01); *H01J 37/32541* (2013.01); *H01L 29/66765* (2013.01)
USPC ....................................................... 438/479

(58) Field of Classification Search
None
See application file for complete search history.

(56) References Cited

U.S. PATENT DOCUMENTS

| 4,342,901 A | 8/1982 | Zajac |
|---|---|---|
| 4,409,134 A | 10/1983 | Yamazaki |

(Continued)

FOREIGN PATENT DOCUMENTS

| CN | 101110434 | 1/2008 |
|---|---|---|
| JP | 02-205681 A | 8/1990 |

OTHER PUBLICATIONS

Chinese Office Action (Application No. 201010213335.3) Dated Oct. 22, 2013.

*Primary Examiner* — Charles Garber
*Assistant Examiner* — Stanetta Isaac
(74) *Attorney, Agent, or Firm* — Eric J. Robinson; Robinson Intellectual Property Law Office, P.C.

(57) ABSTRACT

A structure of the plasma treatment apparatus is employed in which an upper electrode has projected portions provided with first introduction holes and recessed portions provided with second introduction holes, the first introduction hole of the upper electrode is connected to a first cylinder filled with a gas which is not likely to be dissociated, the second introduction hole is connected to a second cylinder filled with a gas which is likely to be dissociated, the gas which is not likely to be dissociated is introduced into a reaction chamber from an introduction port of the first introduction hole provided on a surface of the projected portion of the upper electrode, and the gas which is likely to be dissociated is introduced into the reaction chamber from an introduction port of the second introduction hole provided on a surface of the recessed portion.

16 Claims, 14 Drawing Sheets

(56) References Cited

U.S. PATENT DOCUMENTS

| | | |
|---|---|---|
| 5,031,571 A | 7/1991 | Igarashi et al. |
| 5,571,366 A | 11/1996 | Ishii et al. |
| 5,591,987 A | 1/1997 | Yamazaki et al. |
| 5,820,947 A | 10/1998 | Itoh |
| 6,344,420 B1 | 2/2002 | Miyajima et al. |
| 6,677,648 B1 | 1/2004 | Ohmi |
| 6,830,652 B1 | 12/2004 | Ohmi et al. |
| 7,097,735 B2 | 8/2006 | Ohmi et al. |
| 7,268,404 B2 | 9/2007 | Ohmi |
| 7,279,066 B2 | 10/2007 | Ohmi |
| 7,491,656 B2 | 2/2009 | Ohmi |
| 7,520,245 B2 | 4/2009 | Ohmi et al. |
| 7,819,082 B2 | 10/2010 | Ohmi et al. |
| 2003/0019582 A1* | 1/2003 | Drewery ............ 156/345.43 |
| 2004/0173159 A1* | 9/2004 | Kuthi et al. ............ 118/723 E |
| 2005/0090118 A1* | 4/2005 | Shannon et al. ............ 438/706 |
| 2007/0087455 A1* | 4/2007 | Hoffman ............ 438/5 |
| 2008/0110860 A1* | 5/2008 | Miller et al. ............ 216/71 |
| 2008/0308807 A1 | 12/2008 | Yamazaki et al. |
| 2009/0041950 A1* | 2/2009 | Mizuno et al. ............ 427/569 |
| 2009/0047774 A1 | 2/2009 | Yamazaki |
| 2009/0047775 A1 | 2/2009 | Yamazaki et al. |
| 2009/0142859 A1* | 6/2009 | Liu et al. ............ 438/8 |
| 2009/0233425 A1 | 9/2009 | Furuno et al. |
| 2011/0039414 A1 | 2/2011 | Aya |

\* cited by examiner

PLASMA TREATMENT APPARATUS, METHOD FOR FORMING FILM, AND METHOD FOR MANUFACTURING THIN FILM TRANSISTOR

BACKGROUND OF THE INVENTION

1. Field of the Invention

The present invention relates to a plasma treatment apparatus, a method for forming a film with the use of the plasma treatment apparatus, and a method for manufacturing a thin film transistor with the use of the plasma treatment apparatus.

2. Description of the Related Art

There is a parallel plate plasma treatment apparatus provided with an upper electrode having a projected portion and a recessed portion in order to deposit a uniform film over a substrate with the use of a gas having high degradation efficiency and a gas having low degradation efficiency as material gases. In the plasma treatment apparatus, a gas having high degradation efficiency ($O_2$) is introduced into a treatment chamber from an introduction port of a region of an upper electrode, which is near a lower electrode (that is, a surface of the projected portion of the upper electrode); a gas having low degradation efficiency ($SiF_4$) is introduced into a treatment chamber from an introduction port of a region of the upper electrode, which is distant from the lower electrode (that is, a surface of the recessed portion of the upper electrode); a high-frequency voltage of 13.56 MHz is applied to the lower electrode; and a high-frequency voltage of 27.12 MHz is applied to the upper electrode, whereby plasma is generated between the lower electrode and the upper electrode. At this time, plasma is generated not only between a surface of projected portion of the upper electrode and a surface of the lower electrode but also in the depression of the upper electrode, so that a high density plasma region over the surface of the projected portion of the upper electrode is narrow in a direction perpendicular to a substrate provided over the lower electrode and a high density plasma region in the depression of the upper electrode is wide in a direction perpendicular to the substrate. Since the gas having low degradation efficiency is introduced into the high density plasma region in the depression of the upper electrode from the introduction port provided on the bottom of the depression, the gas having low degradation efficiency is exposed to plasma for a longer time than the gas having high degradation efficiency, which facilitates dissociation. As a result, the speed of plasma treatment can be increased, and the gas having low degradation efficiency is sufficiently dissociated, so that a uniform film can be deposited over the substrate (see Patent Document 1).

REFERENCE

[Patent Document 1] Japanese Published Patent Application No. 2000-269201

SUMMARY OF THE INVENTION

An object of an embodiment of the present invention is to provide a plasma treatment apparatus where a film which is uniform and has good quality can be formed.

An object of an embodiment of the present invention is to form a film which is uniform and has good quality using the plasma treatment apparatus.

An object of an embodiment of the present invention is to manufacture a highly reliable thin film transistor using the plasma treatment apparatus.

An embodiment of the present invention is a plasma treatment apparatus including an upper electrode and a lower electrode. The upper electrode has projected portions provided with first introduction ports and recessed portions provided with second introduction ports, and the distance between the projected portions of the upper electrode is smaller than twice the thickness of a sheath generated at the time of generation of plasma.

An embodiment of the present invention is a plasma treatment apparatus including an upper electrode and a lower electrode. The upper electrode has projected portions provided with first introduction ports and recessed portions provided with second introduction ports, and the difference in height between the projected portion and the recessed portion of the upper electrode is smaller than the thickness of a sheath generated at the time of generation of plasma.

An embodiment of the present invention is a plasma treatment apparatus including an upper electrode and a lower electrode. The upper electrode has projected portions provided with first introduction ports and recessed portions provided with second introduction ports, and bulk plasma with high electron density is generated in the vicinity of the projected portions of the upper electrode.

Note that the kind of a gas introduced into a reaction chamber from the first introduction port may be different from that of a gas introduced into a reaction chamber from the second introduction port.

An embodiment of the present invention is a plasma treatment apparatus including an upper electrode and a lower electrode. The upper electrode has projected portions provided with first introduction holes (first gas pipes) and recessed portions provided with second introduction holes (second gas pipes), the first introduction hole (the first gas pipe) of the upper electrode is connected to a first cylinder filled with a gas which is not likely to be dissociated, the second introduction hole (the second gas pipe) is connected to a second cylinder filled with a gas which is likely to be dissociated, the gas which is not likely to be dissociated is introduced into a reaction chamber from an introduction port of the first introduction hole (the first gas pipe), which is provided on a surface of the projected portion of the upper electrode, and the gas which is likely to be dissociated is introduced into the reaction chamber from an introduction port of the second introduction hole (the second gas pipe), which is provided on a surface of the recessed portion. Note that as described in parentheses, in this specification, an "introduction hole" refers to a gas pipe and an "introduction port" refers to a gas outlet connected to the gas pipe.

An embodiment of the present invention is a method for forming a film using the plasma treatment apparatus.

An embodiment of the present invention is a method for manufacturing a thin film transistor, to which the method for forming a film is applied.

A film which is uniform and has good quality can be formed. Further, a highly reliable thin film transistor can be manufactured.

DETAILED DESCRIPTION OF THE INVENTION

Figure 1:
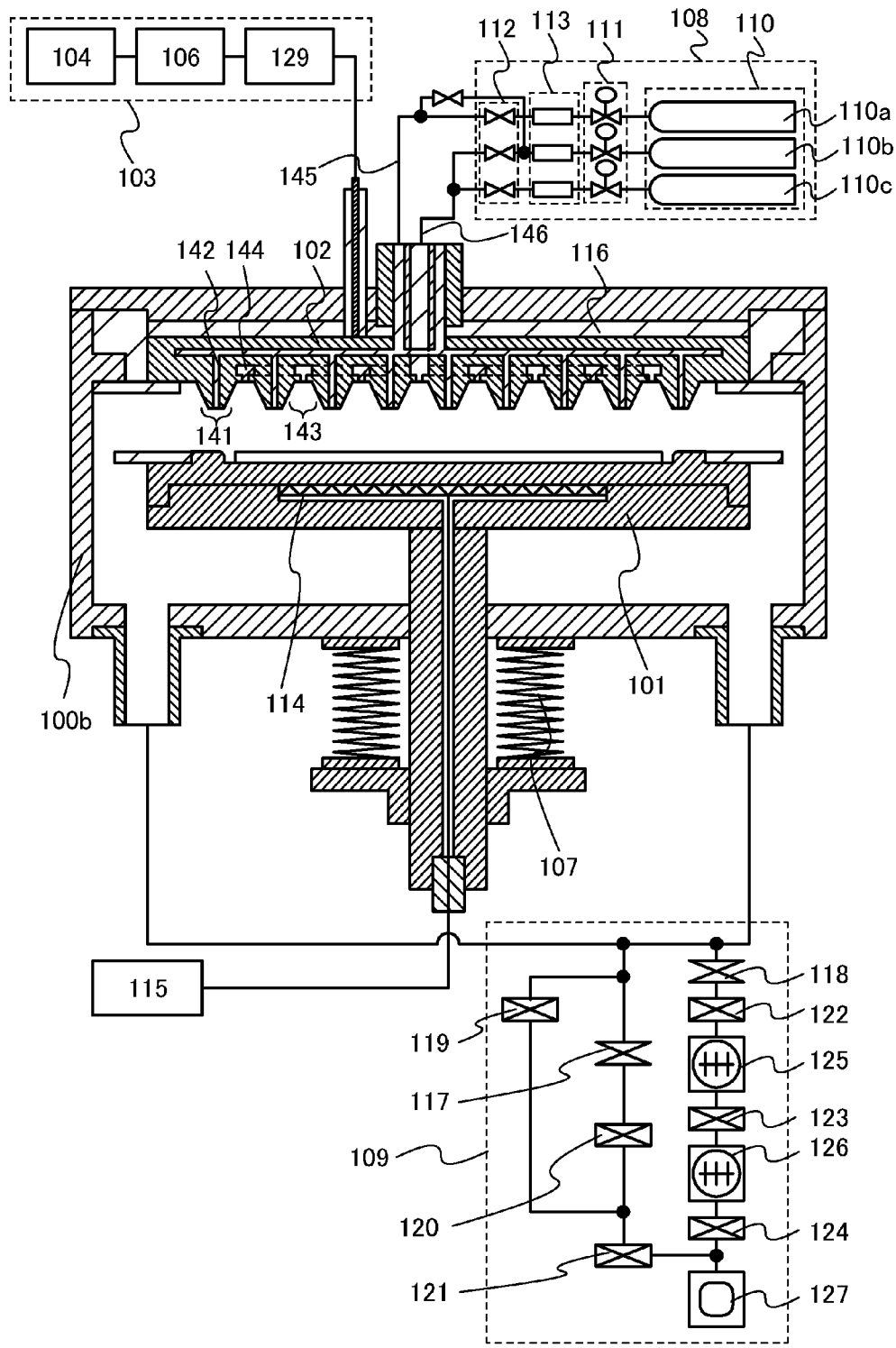
FIG. 1 illustrates an example of a plasma treatment apparatus.

Hereinafter, the embodiments of the present invention are described in detail with reference to drawings. Note that the present invention is not limited to the description in the embodiments below, and it is apparent to those skilled in the art that modes and details can be modified in various ways without departing from the spirit and scope of the present invention. Therefore, the present invention is not construed as being limited to the description of the embodiments below. In describing the structures of the present invention with reference to drawings, reference numerals denoting the same portions are used in different drawings. The same portions are indicated by the same hatching patterns and are not particularly denoted by reference numerals in some cases. In addition, an insulating layer is not illustrated in a top plan view for convenience in some cases. Note that the size, the layer thickness, or the region of each structure illustrated in each drawing is exaggerated for clarity in some cases and thus the actual scale is not necessarily limited to the illustrated scale.

Embodiment 1

FIG. 1 illustrates a structure of a plasma treatment apparatus. A reaction chamber 100b is formed using a stiff material such as aluminum or stainless steel and has a structure in which the inside of the reaction chamber 100b can be vacuum-evacuated. The reaction chamber of the plasma treatment apparatus in this embodiment is formed using stainless steel in order to increase its mechanical strength, and the inside thereof is coated with aluminum by thermal spraying. In addition, the reaction chamber of the plasma treatment apparatus in this embodiment can be disassembled for maintenance, and the inside of the reaction chamber 100b is regularly recoated with aluminum by thermal spraying. The reaction chamber 100b is provided with a second electrode 102 (also referred to as an upper electrode) and a first electrode 101 (also referred to as a lower electrode) which is opposite to the second electrode 102.

A high-frequency power supply unit 103 is connected to the second electrode 102. The first electrode 101 is grounded, and a substrate can be placed on the first electrode 101. The second electrode 102 is insulated from the reaction chamber 100b by an insulating material 116 so that high-frequency power does not leak. In the case where a ceramic material is used for the insulating material 116, it is difficult to use a knife-edge-type metal-seal flange for sealing of the upper electrode and thus, an O-ring seal is preferably used.

Although the first electrode 101 and the second electrode 102 have a capacitively coupled (parallel plate) structure in FIG. 1, an embodiment of the present invention is not limited thereto. Another structure such as an inductively coupled structure may be employed as long as glow discharge plasma can be produced in the reaction chamber 100b by supplying high-frequency power.

The second electrode 102 is a projected and recessed electrode provided with projected portions 141 and recessed portions 143 regularly, preferably at regular intervals. The projected portions 141 can also be referred to as protruding portions of the second electrode 102. In addition, the projected portion 141 of the second electrode 102 is provided with a first introduction hole 142 connected to a gas supply means 108, and the recessed portion 143 of the second electrode 102 is provided with a second introduction hole 144 connected to the gas supply means 108. With such a structure, the kind of gas supplied to the reaction chamber 100b from the projected portion 141 can be different from the kind of gas supplied to the reaction chamber 100b from the recessed portion 143. Here, a region having an introduction port near a surface of the lower electrode is regarded as the projected portion 141 and a region having an introduction port distant from the surface of the lower electrode is regarded as the recessed portion 143.

The first introduction hole 142 is connected to a cylinder 110a of the gas supply means 108, which is filled with a reactive gas (a nitriding gas, an oxidizing gas, or a hydrogen gas), through a gas line 145. The second introduction hole 144 is connected to a cylinder 110c of the gas supply means 108, which is filled with a deposition gas containing silicon or germanium, through a gas line 146. Thus, the reactive gas (the nitriding gas, the oxidizing gas, or the hydrogen gas) is supplied to the reaction chamber 100b from the introduction port of the first introduction hole 142 formed on the projected portion 141. The deposition gas containing silicon or germanium is supplied to the reaction chamber 100b from the introduction port of the second introduction hole 144 formed on the recessed portion 143.

The gas supply means 108 includes a cylinder 110 filled with gases, a pressure adjusting valve 111, a stop valve 112, a mass flow controller 113, and the like. The gas supply means 108 includes the cylinder 110a filled with the reactive gas (the nitriding gas, the oxidizing gas, or the hydrogen gas), a cylinder 110b filled with a dilution gas, and the cylinder 110c filled with the deposition gas containing silicon or germanium. Note that the cylinder 110b filled with the dilution gas may be connected to one of or both the first introduction hole 142 and the second introduction hole 144. Here, the cylinder 110a filled with the reactive gas (the nitriding gas, the oxidizing gas, or the hydrogen gas), the cylinder 110b filled with the dilution gas, and the cylinder 110c filled with the deposition gas containing silicon or germanium each typically have one supply source; however, the cylinders 110a, 110b, and 110c may each have a plurality of supply sources.

As examples of the oxidizing gas filling the cylinder 110a, an oxygen gas, an ozone gas, dinitrogen monoxide gas, and the like are given; however, any other oxidizing gas may be used.

As examples of the nitriding gas filling the cylinder 110a, a nitrogen gas, an ammonia gas, a hydrazine gas, and the like are given; however, any other nitriding gas may be used.

As examples of the deposition gas containing silicon or germanium, which fills the cylinder 110c, a silane ($SiH_4$) gas, a disilane ($Si_2H_6$) gas, a germane ($GeH_4$) gas, a digermane ($Ge_2H_6$) gas, and the like are given; however, any other deposition gas may be used.

As examples of the dilution gas filling the cylinder 110b, rare gases such as a helium gas and a neon gas are given.

A substrate heater 114, a temperature of which is controlled by a heater controller 115, is provided in the first electrode 101. In the case where the substrate heater 114 is provided in the first electrode 101, a thermal conduction heating method is employed. For example, a sheathed heater is used for the substrate heater 114.

The high-frequency power supply unit 103 includes a high-frequency power source 104, a matching box 106, and a high-frequency cut filter 129. High-frequency power supplied from the high-frequency power source 104 is supplied to the second electrode 102. On the output side of the matching box 106, the high-frequency cut filter 129 which blocks a high-frequency component output from the high-frequency power source 104 is provided.

The high-frequency power source 104 supplies high-frequency power with a frequency of 60 MHz or less. In the case where a large substrate of the seventh or later generation is used as a substrate placed on the first electrode 101, the high-frequency power source 104 preferably supplies high-frequency power with a wavelength of approximately 10 m or more. For example, high-frequency power with a frequency of 13.56 MHz or less, particularly, from 3 MHz to 13.56 MHz is preferably supplied. When the high-frequency power source 104 supplies high-frequency power with a frequency in the above range, even if a large substrate of the seventh or later generation is placed on the first electrode 101 and glow discharging is performed, plasma can be generated uniformly over the large substrate without an adverse effect of a surface standing wave; therefore, a film which is uniform and has good film quality can be formed over an entire surface of the large substrate.

For example, when high-frequency power source with a frequency of 13.56 MHz is used for the high-frequency power source 104, a variable capacitor with a capacitance of 10 pF to 100 pF is used for the high-frequency cut filter 129.

By further using a coil for the high-frequency cut filter 129, a parallel resonance circuit using a coil and a variable capacitor may be formed.

An evacuation means 109 connected to the reaction chamber 100b has a function of vacuum evacuation and a function of controlling the reaction chamber 100b to be kept at a predetermined pressure in the case of supplying a reaction gas. The evacuation means 109 includes butterfly valves 117 and 118, stop valves 119 to 124, turbo molecular pumps 125 and 126, a dry pump 127, and the like. The turbo molecular pump 126 is connected to the dry pump 127 through the stop valve 124.

In the case of vacuum-evacuating the reaction chamber 100b, first, the stop valve 119 and the stop valve 121 for rough vacuum are opened and the reaction chamber 100b is evacuated with the dry pump 127. Then, the stop valve 119 is closed and the butterfly valve 117 and the stop valve 120 are opened for vacuum evacuation. In the case of performing ultrahigh vacuum evacuation to obtain a pressure lower than $10^{-5}$ Pa in the reaction chamber 100b, the reaction chamber 100b is evacuated with the dry pump, the butterfly valve 117 and the stop valves 120 and 121 are closed, the butterfly valve 118 and the stop valves 122 to 124 are opened, and then vacuum evacuation is performed using the turbo molecular pumps 125 and 126 and the dry pump 127 which are connected in series. In addition, after the vacuum evacuation is performed, the reaction chamber 100b is preferably subjected to heat treatment so that degassing of the inner wall is performed.

A distance (also referred to as a gap) between the first electrode 101 and the second electrode 102 can be adjusted as appropriate. The gap between the electrodes can be adjusted in such a manner that the height of the first electrode 101 is changed in the reaction chamber 100b. By using a bellows 107, the gap between the electrodes can be adjusted with the reaction chamber 100b maintained in a vacuum.

Figure 2:
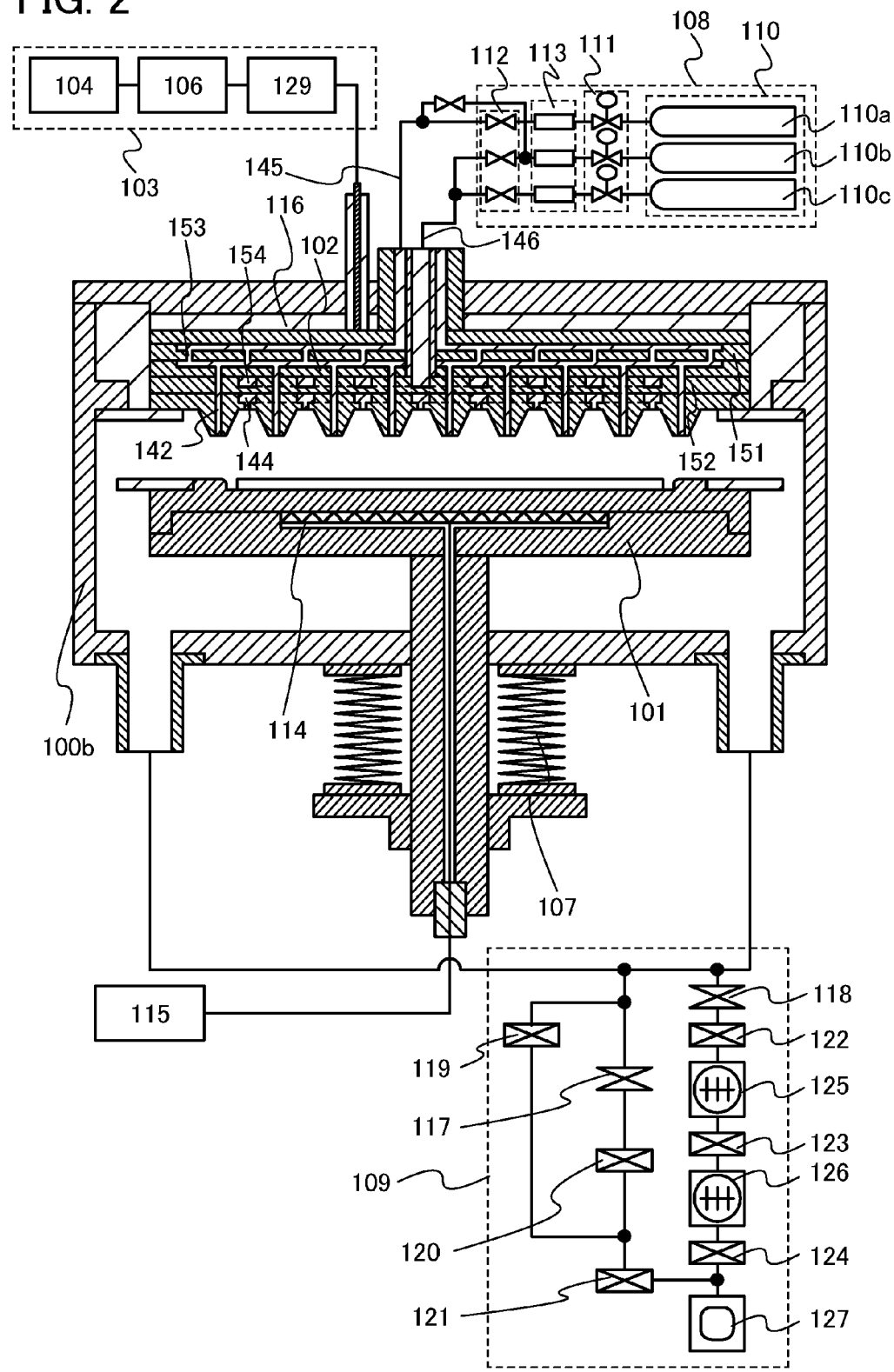
FIG. 2 illustrates an example of a plasma treatment apparatus.

Further, the second electrode 102 may include a plurality of diffusing plates (see FIG. 2). A gas supplied from the gas line 145 is diffused by a diffusing plate 151 and then supplied to the reaction chamber 100b from the introduction port of the first introduction hole 142 formed on the projected portion 141 through a through hole 153 of the diffusing plate 151. A gas supplied from the gas line 146 is diffused by a diffusing plate 152 and then supplied to the reaction chamber 100b from the introduction port of the second introduction hole 144 formed on the recessed portion 143 through a through hole 154 of the diffusing plate 152. As illustrated in FIG. 2, since the second electrode 102 includes the diffusing plates 151 and 152, gases introduced from the gas lines 145 and 146 are sufficiently diffused in the second electrode 102 and a homogeneous gas can be supplied to the reaction chamber 100b, and thus a film that is uniform and has good film quality can be formed over a substrate.

Figure 3A:
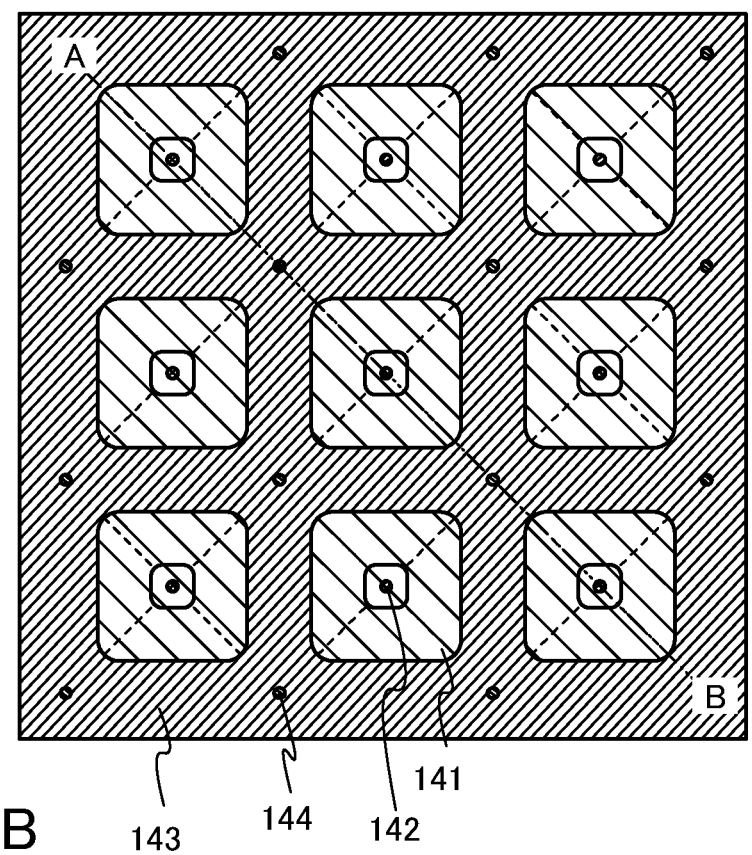
FIGS. 3A and 3B illustrate a shape of an upper electrode of a plasma treatment apparatus.
Figure 3B:
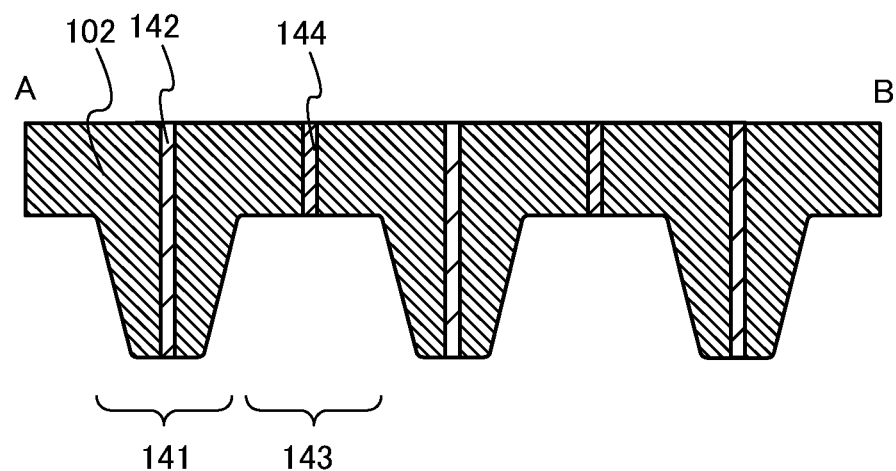
Figure 4A:
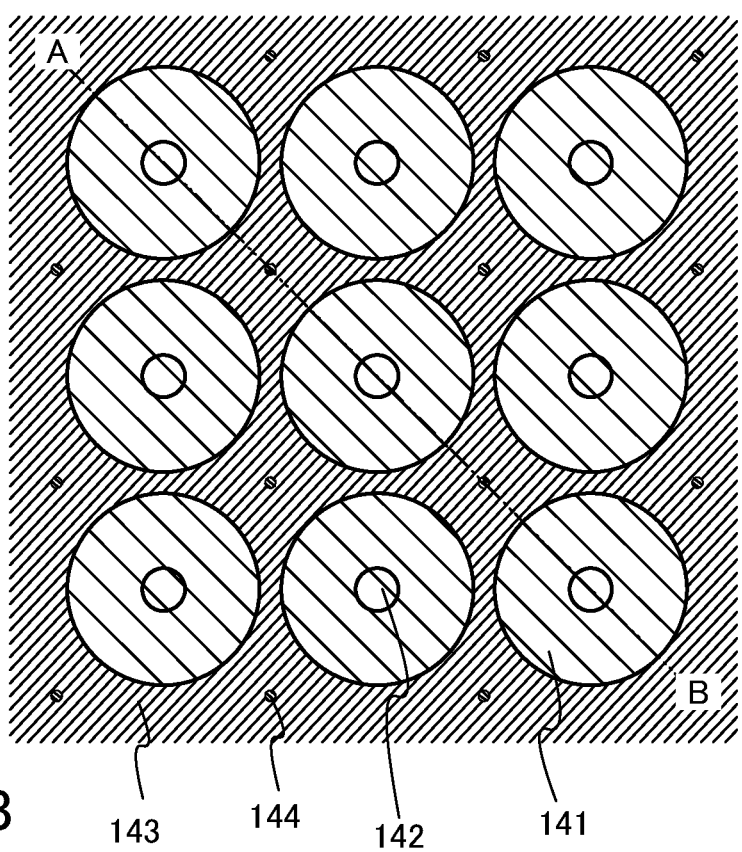
FIGS. 4A and 4B illustrate a shape of an upper electrode of a plasma treatment apparatus.
Figure 4B:
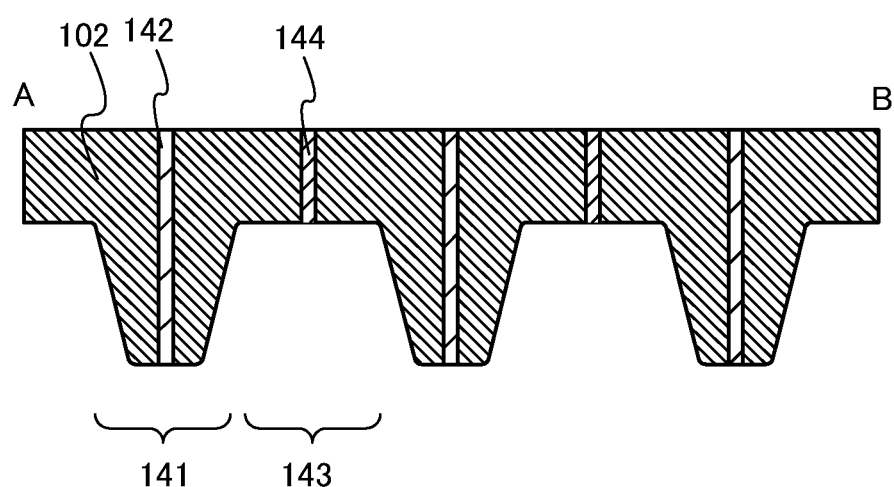

Here, modes of shapes of the second electrode 102 are described with reference to FIGS. 3A and 3B and FIGS. 4A and 4B. FIGS. 3A and 4A are plan views of the second electrode 102 seen from the first electrode 101 side, and FIGS. 3B and 4B are cross-sectional views taken along A-B in FIGS. 3A and 4A. In order to clearly illustrate the state of unevenness, regions which are projected to the first electrode 101 side (that is, projected portions) are shown by a wide hatch pattern and regions which are recessed (that is, recessed portions) are shown by a narrow hatch pattern.

As illustrated in FIG. 3A, introduction ports of the first introduction holes 142 formed on the projected portions 141 and introduction ports of the second introduction holes 144 formed on the recessed portions 143 are provided regularly, preferably, at regular intervals. Further, as illustrated in FIG. 3B, the introduction ports of the first introduction holes 142 are provided on the projected portions 141, and the introduction ports of the second introduction holes 144 are provided on the recessed portions 143. The projected portions 141 are separated from one another and the recessed portions 143 are on one continuous plane. Here, the projected portions 141 are truncated quadrangular pyramids. Note that the shape of the projected portions 141 is not limited thereto and truncated triangular pyramids, truncated pentangular pyramids, truncated hexangular pyramids, or any other truncated multiangular pyramids may be employed as appropriate. The projected portions 141 are preferably truncated multiangular pyramids with round corners obtained by rounding edges and vertexes of the projected portions 141.

Alternatively, as illustrated in FIG. 4A, projected portions 141 may be truncated cones. As illustrated in FIG. 4B, the introduction ports of the first introduction holes 142 are provided on the projected portions 141, and the introduction ports of the second introduction holes 144 are provided on the recessed portions 143. Note that the projected portions 141 are preferably truncated cones with round corners obtained by rounding edges of the projected portions 141.

In FIGS. 3A and 3B and FIGS. 4A and 4B, edges and vertexes of the projected portions 141 and the recessed portions 143 are rounded, whereby local arc discharge can be suppressed and generation of particles can be reduced.

Figure 5:
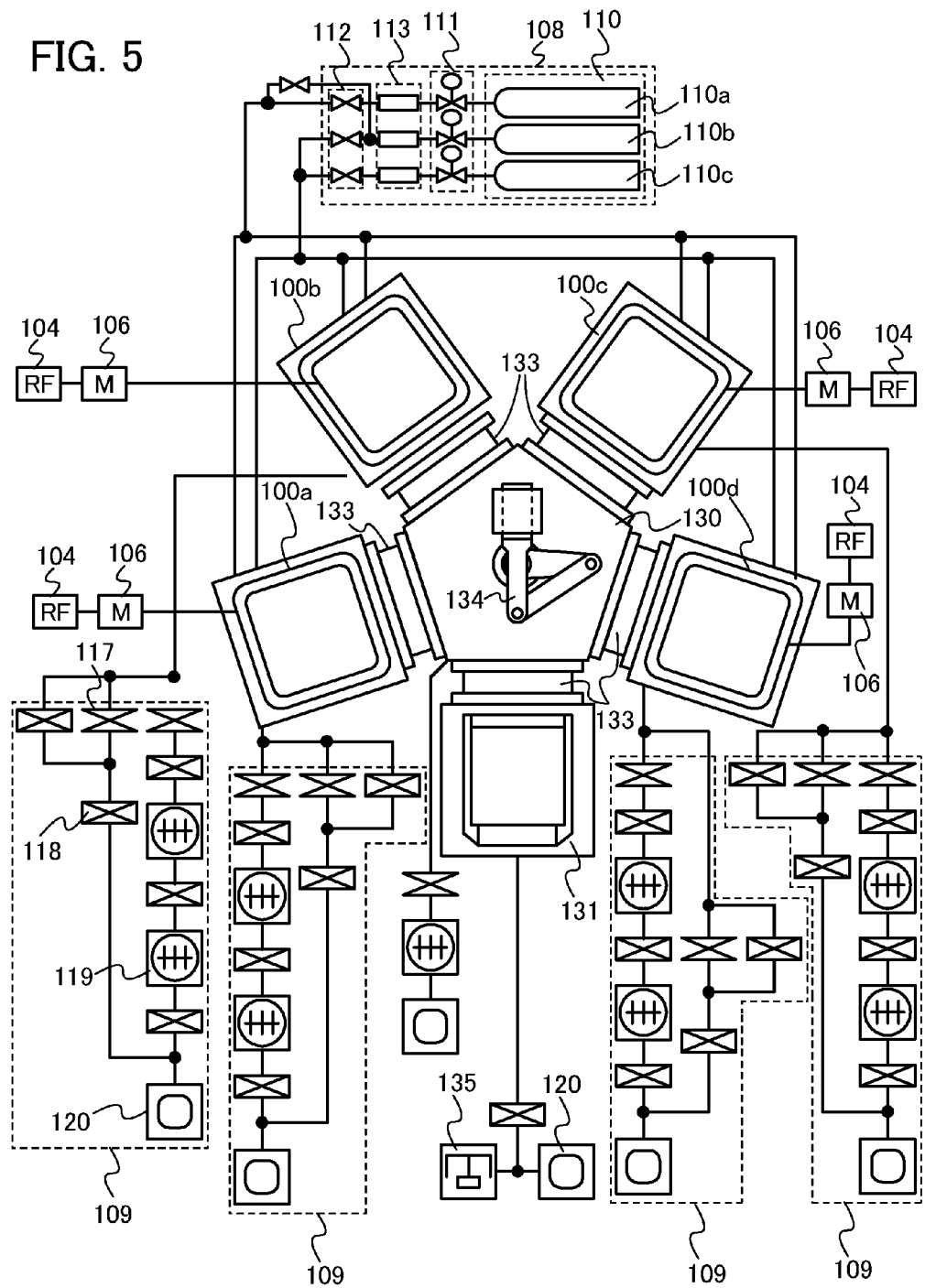
FIG. 5 illustrates an example of a structure of a deposition apparatus.

FIG. 5 is a schematic diagram illustrating one mode of a multi-chamber plasma treatment apparatus provided with a plurality of reaction chambers. This apparatus is provided with a common chamber 130, a load/unload chamber 131, a first reaction chamber 100a, the second reaction chamber 100b, a third reaction chamber 100c, and a fourth reaction chamber 100d. This multi-chamber plasma treatment apparatus is a single-wafer processing type in which a substrate set in a cassette in the load/unload chamber 131 is carried in and out of each reaction chamber by a transport unit 134 of the common chamber 130. A gate valve 133 is provided between the common chamber 130 and each reaction chamber so that treatments conducted in the reaction chambers do not interfere with each other.

The reaction chambers are separately used for forming different kinds of thin films. Needless to say, the number of the reaction chambers is not limited to four and may be increased or decreased as needed. Further, one film may be formed in one reaction chamber, or a plurality of films may be formed in one reaction chamber.

The evacuation means 109 is connected to each reaction chamber. The evacuation means is not limited to a combination of the vacuum pumps illustrated in FIGS. 1 and 5 and another vacuum pump can be used as long as evacuation can be performed to a degree of vacuum within the range of approximately $10^{-5}$ Pa to $10^{-1}$ Pa. A butterfly valve provided between the evacuation means 109 and each reaction chamber allows the inside of the chamber which is vacuum-evacuated to be separated from the air. The pumping speed is controlled by a stop valve and a turbo molecular pump, so that pressure in each reaction chamber can be adjusted.

A cryopump 135 that can perform ultra-high vacuum evacuation may be connected to the load/unload chamber 131. By using the cryopump 135, ultra-high vacuum evacuation can be performed on the load/unload chamber 131 so that a pressure lower than $10^{-5}$ Pa in the load/unload chamber 131 can be obtained, and the concentration of an impurity element contained in a film deposited on a substrate in the reaction chamber can be reduced. Further, the pumping speed of the cryopump 135 is higher than that of either the turbo molecular pump or the dry pump; therefore, by connecting the cryopump 135 to the load/unload chamber 131 that is opened and closed frequently, the throughput can be increased.

The gas supply means 108 includes the cylinder 110 filled with gases, the pressure adjusting valve 111, the stop valve 112, the mass flow controller 113, and the like. The gas supply means 108 includes the cylinder 110a filled with a reactive gas (a nitriding gas, an oxidizing gas, or a hydrogen gas), the cylinder 110b filled with a dilution gas, and the cylinder 110c filled with a deposition gas containing silicon or germanium. Note that the cylinder 110b filled with the dilution gas may be connected to one of or both the first introduction hole 142 and the second introduction hole 144. Here, the cylinder 110a filled with the reactive gas (the nitriding gas, the oxidizing gas, or the hydrogen gas), the cylinder 110b filled with the dilution gas, and the cylinder 110c filled with the deposition gas containing silicon or germanium each typically have one supply source; however, these cylinders may each have a plurality of supply sources.

A high-frequency power supply unit for generating plasma is connected to each reaction chamber. The high-frequency power supply unit includes at least the high-frequency power source 104 and the matching box 106.

The reaction chambers can be separately used for forming different kinds of thin films. Since the optimal deposition temperatures vary between thin films, the reaction chambers are separately used so that the deposition temperatures of films to be formed can be separately controlled easily. In addition, the same kind of films can be deposited repeatedly; therefore, the influence of residual impurities due to a film which has been formed can be eliminated.

Figure 6:
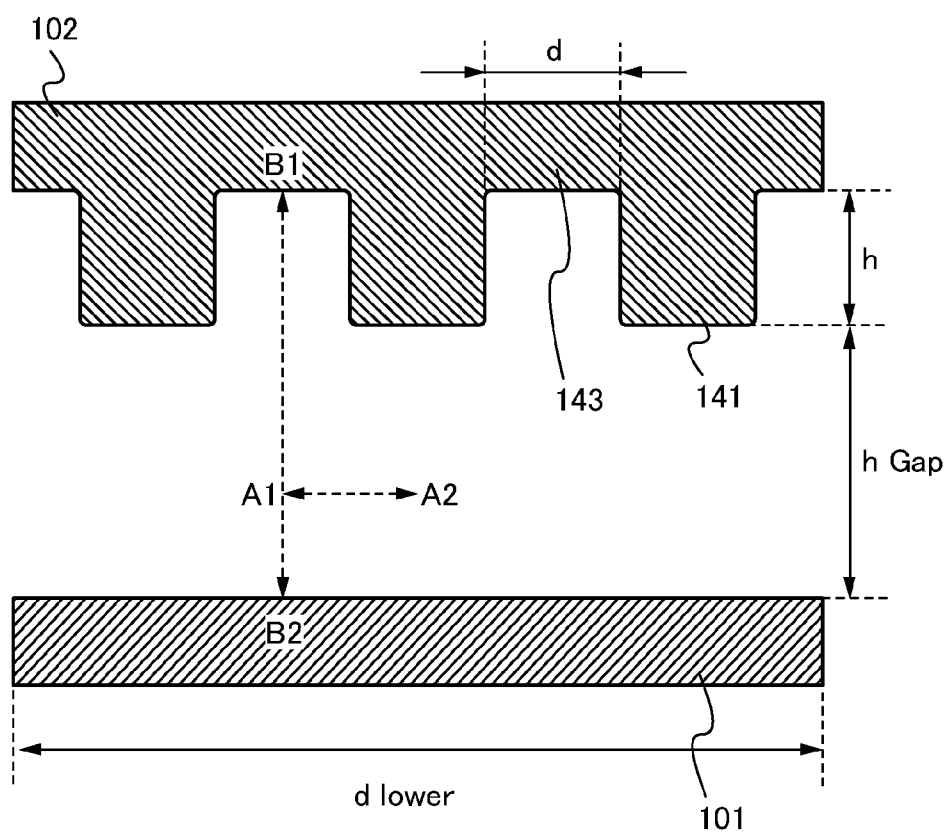
FIG. 6 illustrates an upper electrode and a lower electrode of a plasma treatment apparatus.

FIG. 6 is a view illustrated for describing parameters used for calculations of details of the shapes and sizes of the second electrode 102 and the first electrode 101 illustrated in FIG. 1. The second electrode 102 is provided with the projected portions 141 and the recessed portions 143, and the projected portions 141 are not tapered.

In FIG. 6, h indicates the depth of a depression of the second electrode 102, which is the height of the projected portion 141 of the second electrode 102 (the difference in height between a surface of the top of the projected portion 141 and a surface of the recessed portion 143). Further, $h_{Gap}$ indicates the distance between the electrodes, which is the distance between the projected portion 141 of the second electrode 102 and the first electrode 101 (the difference in height between the surface of the top of the projected portion 141 and a surface of the first electrode 101). Further, d indicates the width of the recessed portion 143, which is the distance between the projected portion 141 and the adjacent projected portion 141. Further, $d_{lower}$ indicates the diameter of the lower electrode.

Figure 7A:
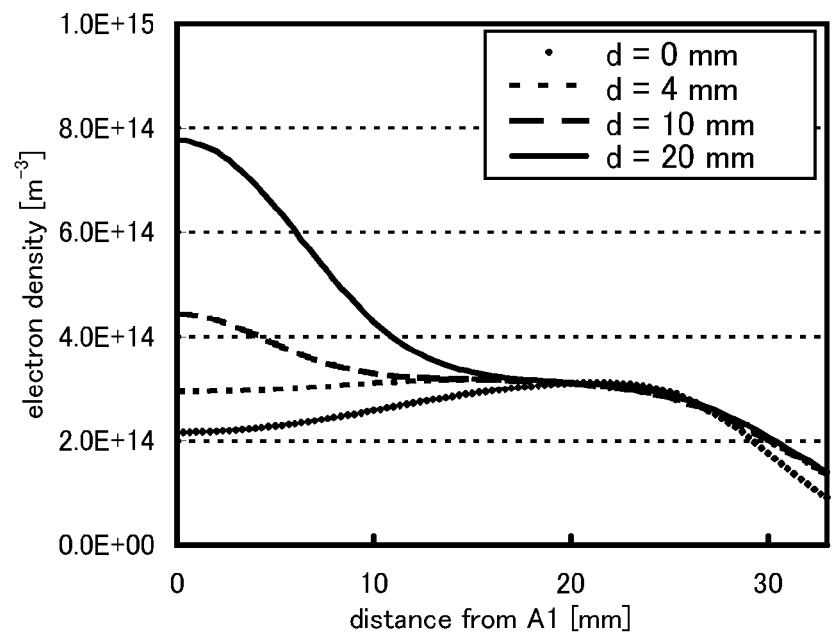
FIGS. 7A and 7B show calculation results.
Figure 7B:
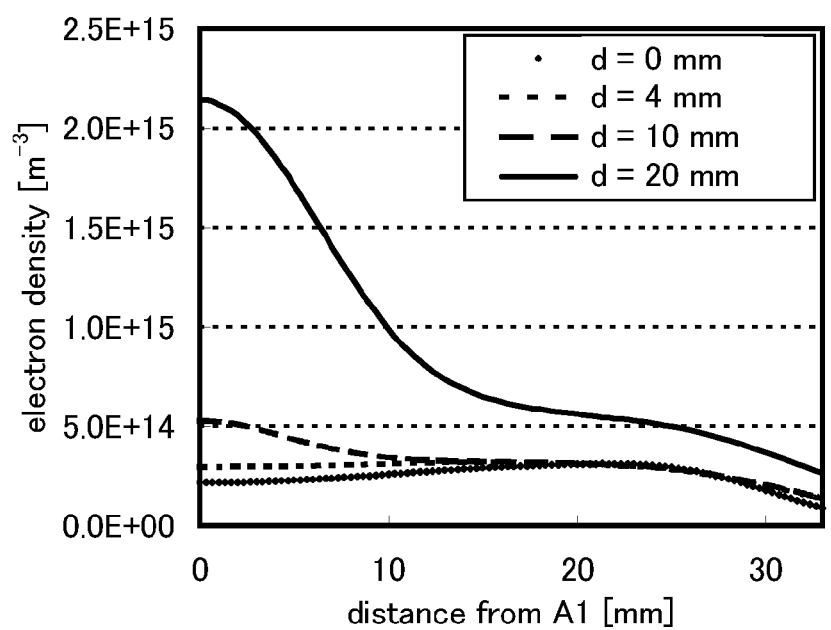

FIGS. 7A and 7B show calculation results of electron density distributions along A1-A2 in FIG. 6. The horizontal axis represents the distance from A1 to A2 (that is, the distance from the center of the recessed portion 143 to the projected portion 141) and the vertical axis represents the electron density. FIG. 7A shows the electron density distributions where the width d of the recessed portion 143 is 0 mm (a parallel plate without projected portions and recessed portions), 4 mm, 10 mm, or 20 mm when the depth h of the depression of the second electrode 102 is 4 mm. FIG. 7B shows the electron density distributions where the width d of the recessed portion 143 is 0 mm (a parallel plate without projected portions and recessed portions), 4 mm, 10 mm, or 20 mm when the depth h of the depression of the second electrode 102 is 20 mm.

As is evident from FIGS. 7A and 7B, as the width of the recessed portion 143 increases, the difference in electron density between a region directly under the recessed portion 143 and a region distant from the recessed portion is widened. Further, as the depth of the depression of the second electrode 102 increases, the difference in electron density is widened because plasma enters into the depression of the second electrode 102 more easily. From the above, when the width of the recessed portion 143 and the depth of the depression of the second electrode 102 are each 10 mm or smaller, plasma can be generated over a surface of the projected portion 141 while plasma is not generated in the depression of the second electrode 102.

Figure 8A:
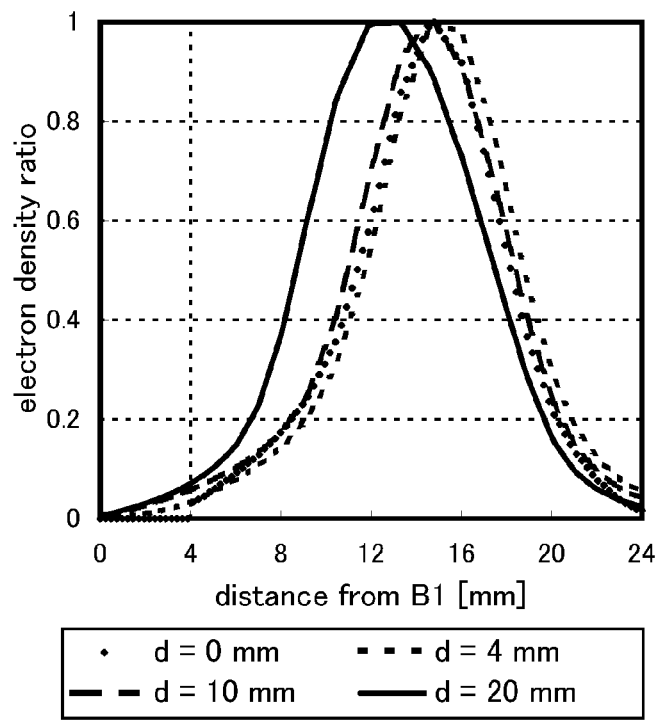
FIGS. 8A and 8B show calculation results.
Figure 8B:
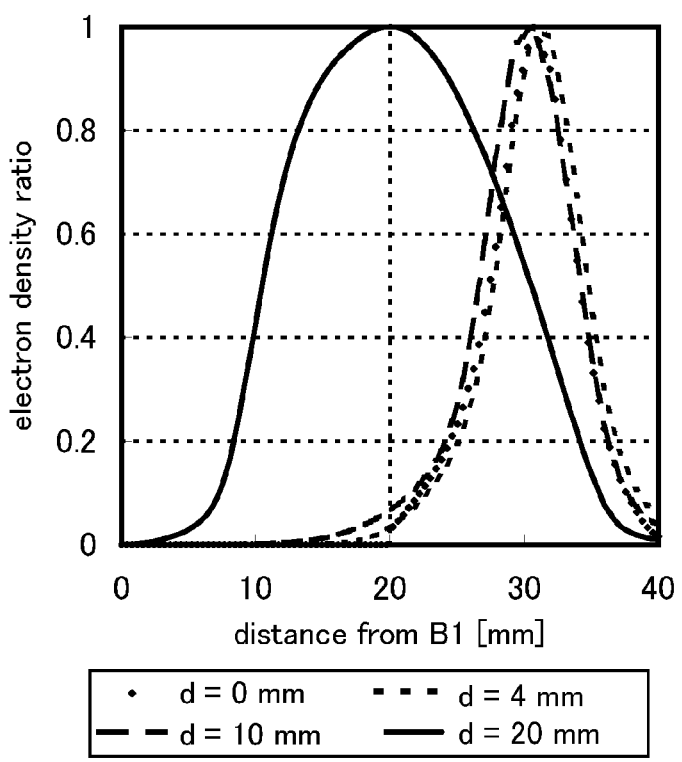

FIGS. 8A and 8B show calculation results of the electron density distributions along B1-B2 in FIG. 6. The horizontal axis represents the distance from B1 to B2 (that is, the distance between the surface of the recessed portion 143 and the first electrode 101), and the vertical axis represents the electron density ratio. Note that, in FIGS. 8A and 8B, the electron density ratio is normalized based on the maximum of the electron density in each of the depressions. FIG. 8A shows the distributions of electron density ratios where the width d of the recessed portion 143 is 0 mm (a parallel plate without projected portions and recessed portions), 4 mm, 10 mm, or 20 mm when the depth h of the depression of the second electrode 102 is 4 mm. FIG. 8B shows the distributions of electron density ratios where the width d of the recessed portion 143 is 0 mm (a parallel plate without projected portions and recessed portions), 4 mm, 10 mm, or 20 mm when the depth h of the depression of the second electrode 102 is 20 mm. The calculations were carried out under the condition that the pressure was 100 Pa, the voltage was 100 V, and the frequency of the high-frequency power source was 13.56 MHz.

From FIG. 8A, when the depth h of the depression of the second electrode 102 is 4 mm, plasma can be generated over the surface of the projected portion 141 while plasma is not generated in the depression of the second electrode 102. From FIG. 8B, when the depth h of the depression of the second electrode 102 is 20 mm, by setting the width of the recessed portion 143 to be 10 mm or smaller, plasma can be generated over the surface of the projected portion 141 while plasma is not generated in the depression of the second electrode 102. This is because the thickness of a sheath is approximately several millimeters under the condition used for the calculations. From FIG. 8B, in order not to generate plasma in the depression of the second electrode 102, the width of the recessed portion 143 needs to be approximately twice the thickness of the sheath or smaller. Further, a low pressure and a low power are needed.

As described above, in order not to generate plasma in the recessed portion, the width of the recessed portion 143 is preferably approximately twice the thickness of the sheath or smaller.

Alternatively, the depth of the depression of the second electrode 102 may be set to be smaller than the thickness of the sheath so that plasma is not generated in the depression of the second electrode 102.

Note that the thickness of the sheath is controlled by changing the frequency or the voltage of the high-frequency power source, the pressure in the reaction chamber, or the like. In particular, when the frequency of the high-frequency power source is set to be low, the thickness of the sheath can be larger.

Figure 9A:
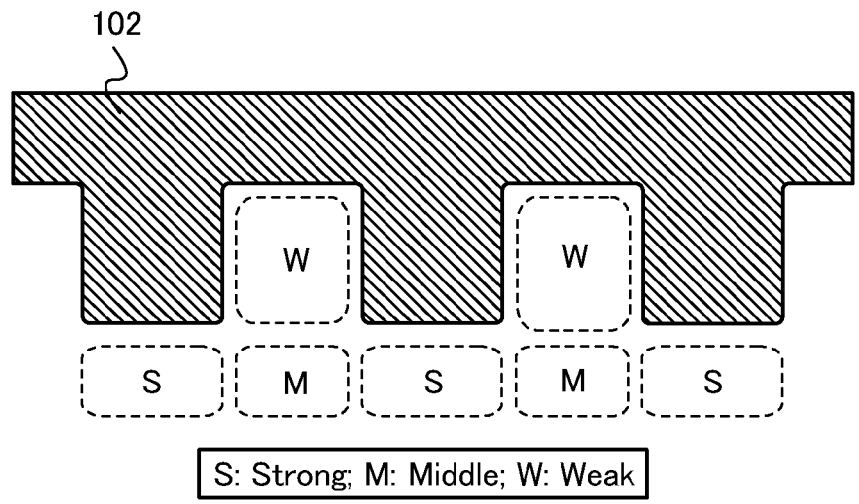
FIGS. 9A and 9B each illustrate intensity of plasma in a plasma treatment apparatus.
Figure 9B:
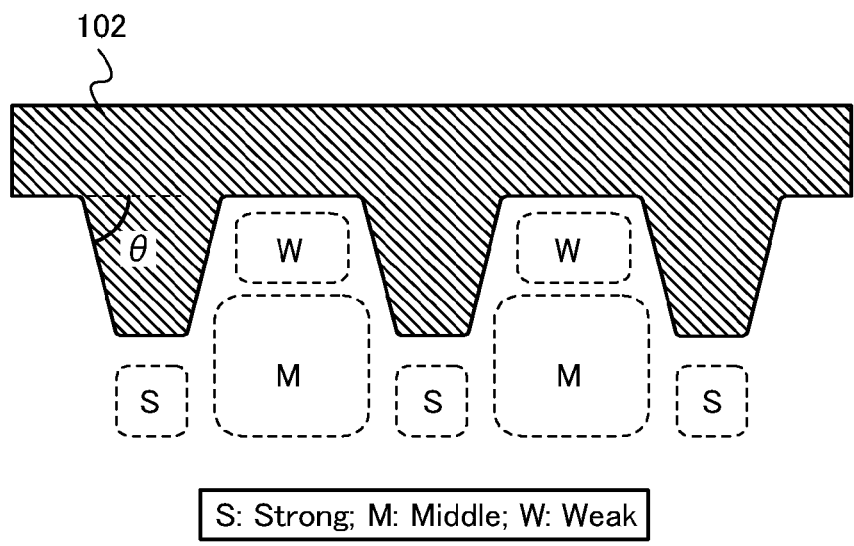

FIGS. 9A and 9B show calculation results of the intensities of electromagnetic fields. FIG. 9A shows the distribution of the intensities of electromagnetic fields in the case where side surfaces of projected portions are perpendicular to surfaces of recessed portions as in FIG. 6 or the like. FIG. 9B shows the distribution of the intensities of electromagnetic fields in the case where projected portions of the second electrode 102 are tapered. The cross section of the projected portion of the second electrode 102 illustrated in FIG. 9B is tapered and this taper angle is defined as θ. That is, the taper angle θ indicates an angle formed by the side surface of the projected portion and the surface of the recessed portion. In the case where the cross section of the projected portion is tapered, the cross-sectional area is monotonously reduced toward the introduction port side.

In FIG. 9B, when the taper angle θ gets smaller, electromagnetic waves can reach a surface of the recessed portion more easily. Thus, a region where an electric field is extremely weak can be reduced to reduce an electric field, which can suppress ion damages and generation of particles due to arc discharge. Note that as a region of a surface of the top of the projected portion is reduced, a region where an electric field is intense can be concentrated on the top.

Figure 10A:
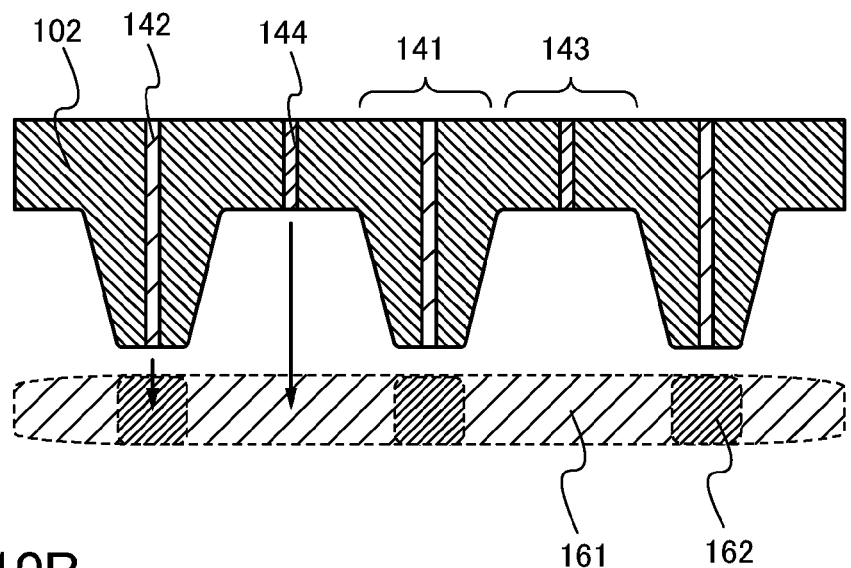
FIGS. 10A and 10B each illustrate intensity of plasma in a plasma treatment apparatus.

As for the plasma treatment apparatus described in this embodiment, the width of the recessed portion 143 of the second electrode 102 is set to be smaller than or equal to approximately twice the thickness of the sheath or the depth of the depression of the second electrode 102 is set to be smaller than the thickness of the sheath. Accordingly, when high-frequency power is supplied to the second electrode 102 of the plasma treatment apparatus, grow discharge occurs between the second electrode 102 and the first electrode 101 and thus as illustrated in FIG. 10A, the sheath can be generated in the depression of the second electrode 102 and bulk plasma 161 can be generated on the projected portion 141 side of the second electrode 102. Then, a high density plasma region 162 can be generated in the vicinity of the projected portion 141 (directly under the protruding portion or a first gas introduction port), in the bulk plasma 161.

Embodiment 2

In this embodiment, a method for forming a film using the plasma treatment apparatus described in Embodiment 1 will be described. Here, description will be given with reference to FIG. 1 and FIGS. 10A and 10B.

In the plasma treatment apparatus illustrated in FIG. 1, a reactive gas (a nitriding gas, an oxidizing gas, or a hydrogen gas) filling the cylinder 110a of the gas supply means 108 is introduced into the reaction chamber 100b from an introduction port of the first introduction hole 142 provided inside the projected portion 141 of the second electrode 102.

The deposition gas containing silicon or germanium, which fills the cylinder 110c of the gas supply means 108, is introduced into the reaction chamber 100b from an introduction port of the second introduction hole 144 provided inside the recessed portion 143 of the second electrode 102.

Then, after a gas in the reaction chamber 100b is evacuated using the evacuation means 109, the pressure in the reaction chamber 100b is adjusted.

After that, high-frequency power is supplied to the second electrode 102 of the plasma treatment apparatus described in Embodiment 1, whereby grow discharge occurs between the second electrode 102 and the first electrode 101 and as illustrated in FIG. 10A, the bulk plasma 161 is generated on the side of the projected portion 141 of the second electrode 102. Then, in the bulk plasma 161, the high density plasma region 162 is generated in the vicinity of the projected portion 141. On the other hand, bulk plasma is not generated and a sheath is generated under the recessed portion 143 of the second electrode 102.

In the high density plasma region 162 of the bulk plasma 161, electron density is high and frequency of ionization per unit time is high; thus, the reactive gas (the nitriding gas, the oxidizing gas, or the hydrogen gas) introduced into the reaction chamber from the first introduction hole 142 is easily dissociated to be an active species with high energy. Even when a gas which is not easily dissociated is introduced into the reaction chamber, the gas is easily dissociated because frequency of ionization is high in the high density plasma region 162.

When the deposition gas containing silicon or germanium contains higher-order silane or an associated molecule to which one or a plurality of higher-order silane and silane are bonded by molecular attraction, the higher-order silane or the associated molecule does not react sufficiently and partly remains unreacted and deposited over a substrate. This is a cause of a film defect.

However, a film is formed over the substrate using the plasma treatment apparatus described in Embodiment 1, which facilitates reaction of the associated molecule or a cluster contained in the deposition gas containing silicon or germanium with an active species with high energy obtained by dissociation of the reactive gas (the nitriding gas, the oxidizing gas, or the hydrogen gas). Thus, part of unreacted higher-order silane or silicon cluster is not likely to be deposited over the substrate as it is, so a film having fewer defects can be deposited over the substrate.

Figure 10B:
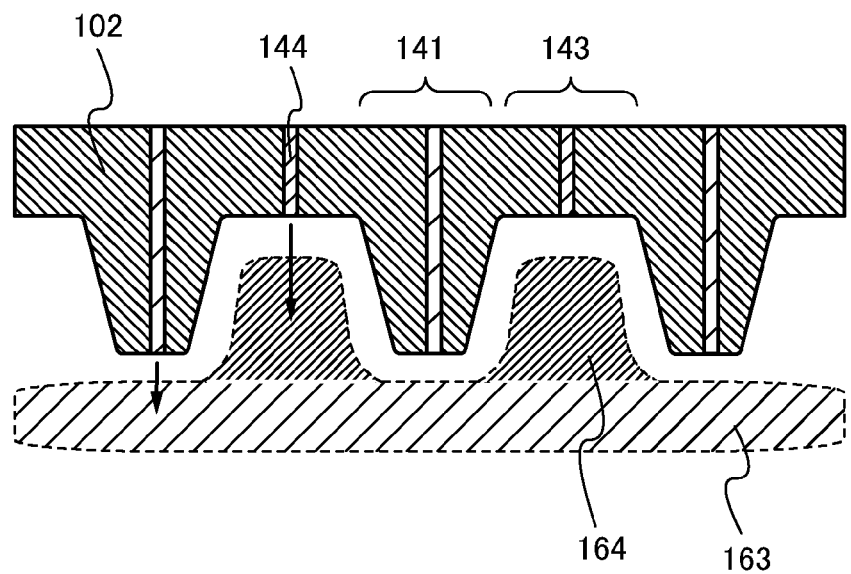

On the other hand, as illustrated in FIG. 10B, when the bulk plasma 163 is generated over a surface of the second electrode 102 and in the depression of the second electrode 102, and further, the high density plasma region 164 is generated between the projected portions 141 adjacent to each other (on the periphery of side surfaces of protruding portions or directly under the second gas introduction port), the deposition gas containing silicon or germanium, which is introduced from the second introduction hole 144, is changed into active species in the high density plasma region 164 and the active species react with each other in the high density plasma region 164 so that an associated molecule and a cluster are generated.

However, when glow discharge is caused using the plasma treatment apparatus described in Embodiment 1 in this embodiment, as illustrated in FIG. 10A, the bulk plasma 161 is not generated and a sheath is generated under the recessed portion 143 of the second electrode 102. Therefore, the deposition gas containing silicon or germanium, which is introduced into the reaction chamber from the second introduction hole 144, is changed into active species but the reaction between the active species is not facilitated. Accordingly, an associated molecule and a cluster are not generated and the active species of the deposition gas containing silicon or germanium move to a surface of the substrate. Alternatively, the active species of the deposition gas containing silicon or germanium react with the active species with high energy obtained by dissociation in the high density plasma region 162 and are deposited over the substrate.

Thus, in the deposition gas containing silicon or germanium, which is introduced into the reaction chamber, active species are generated but reaction between the active species is suppressed, and the deposition gas containing silicon or germanium is dissociated by reaction with the active species with high energy obtained by dissociation in the high density plasma region 162. Therefore, the associated molecule or the cluster can be prevented from remaining unreacted and being deposited, and a uniform film having fewer defects can be formed over the substrate.

Next, a mechanism will be described where an associated molecule contained in a deposition gas containing silicon or germanium is degraded by active species generated by dissociation of a reactive gas (a nitriding gas, an oxidizing gas, or a hydrogen gas) in bulk plasma. Here, microscopic models of degradation mechanisms of disilane ($Si_2H_6$) were calculated using a density-functional approach, where an amino radical ($NH_2^*$) was used as a typical example of active species generated by dissociation of the reactive gas (the nitriding gas, the oxidizing gas, or the hydrogen gas) in plasma and disilane that was an example of a silicon associated molecule was used as an associated molecule. As software for calculation, software for quantum chemistry calculation Gaussian03 developed by Gaussian, Inc. was used.

A model (Model 1) where disilane ($Si_2H_6$) and an amino radical ($NH_2^*$) react to generate a silyl radical ($SiH_3^*$) and amino silane ($SiNH_5$) is represented by Reaction Formula 1.

$$Si_2H_6 + NH_2^* \rightarrow SiNH_5 + SiH_3^* \quad (1)$$

Further, a model (Model 2) where disilane ($Si_2H_6$) and an amino radical ($NH_2^*$) react to generate a disilane radical ($Si_2H_5^*$) and ammonia is represented by Reaction Formula 2.

$$Si_2H_6 + NH_2^* \rightarrow Si_2H_5^* + NH_3 \quad (2)$$

Figure 11A:
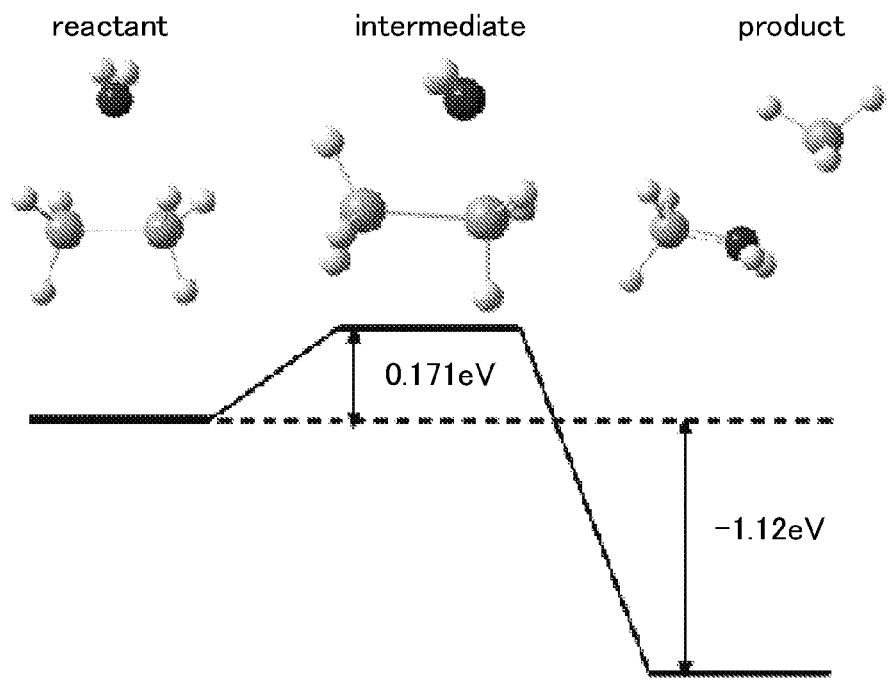
FIGS. 11A and 11B show calculation results.
Figure 11B:
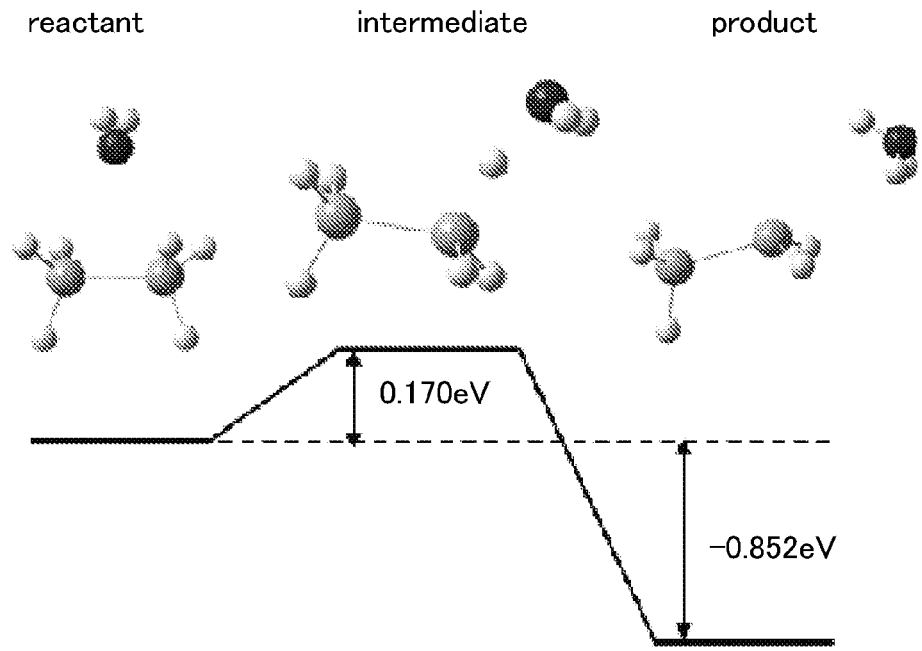

FIGS. 11A and 11B show energy diagrams obtained by calculating energy of products and activation energy on the basis of energy of reactants and schematic diagrams of models of molecules of Model 1 and Model 2. Note that activation energy is represented by a difference between energy of intermediates and energy of the reactants. FIGS. 11A and 11B show calculation results of Reaction Formula 1 and Reaction Formula 2, respectively.

From FIG. 11A, activation energy in a transition state of Model 1 is 0.171 eV. Energy of the product is −1.12 eV. Since the energy of the product is lower than the energy of reactant, it can be seen that the product is more stable than the reactant.

From FIG. 11B, activation energy in a transition state of Model 2 is 0.170 eV. Energy of the product is −0.852 eV. Since the energy of the product is lower than the energy of the reactant, it can be seen that the product is more stable than the reactant.

Activation energy of reaction for generating a silyl radical from disilane and an amino radical (reaction barrier 1) shown by Model 1 and activation energy of reaction for generating ammonia from disilane and an amino radical (reaction barrier 2) shown by Model 2 are substantially equivalent; therefore, it can be said that the reaction speeds of the two models are substantially equal to each other. That is to say, it is understood that disilane is degraded by an amino radical.

In Model 1, a reaction barrier 3 from the product to the intermediate is 1.29 eV, the difference of energy of the product and activation energy. In Model 2, a reaction barrier 4 from the product to the intermediate is 1.02 eV through similar calculation. Since the reaction barriers 3 and 4 are larger than the reactive barriers 1 and 2, such a reaction that the products return to disilane and an amino radical is unlikely to occur.

According to the above, it is understood that disilane is degraded in an atmosphere containing an amino radical to generate a disilane radical and a silyl radical. The disilane radical generated in Reaction Formula 2 reacts with another amino radical to be degraded, so that a silyl radical is generated. That is, in the plasma treatment apparatus in FIG. 1 including the second electrode 102 whose surface is uneven and being capable of generating bulk plasma in the vicinity of the projected portion 141, the reactive gas (the nitriding gas, the oxidizing gas, or the hydrogen gas) is introduced into the reaction chamber from the introduction port of the first introduction hole 142 in the projected portion 141 and the deposition gas containing silicon or germanium is introduced into the reaction chamber from the introduction port of the second introduction hole 144 in the recessed portion 143. Accordingly, the associated molecule or the cluster contained in the deposition gas containing silicon or germanium reacts with active species with high energy obtained by dissociation of the reactive gas (the nitriding gas, the oxidizing gas, or the hydrogen gas) and is degraded, so that the higher-order silane or the silicon cluster is unlikely to be deposited over the substrate and thus a film having fewer defects can be formed over the substrate.

Embodiment 3

In this embodiment, a method for manufacturing a thin film transistor using the plasma treatment apparatus described in Embodiment 1 will be described with reference to FIGS. 12A to 12C and FIGS. 13A to 13C.

Here, it is all thin film transistors formed over one substrate preferably have the same conductivity type because the number of steps can be reduced. Thus, a method for manufacturing n-channel thin film transistors will be described in this embodiment.

Figure 12A:
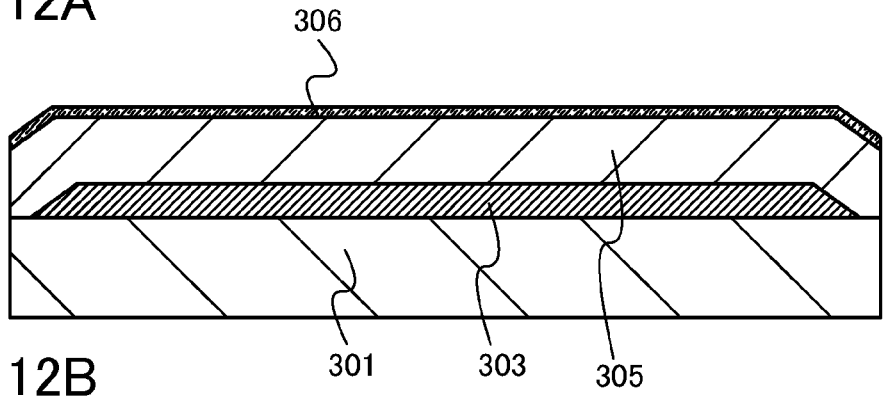
FIGS. 12A to 12C illustrate an example of a method for manufacturing a thin film transistor.

As illustrated in FIG. 12A, a gate electrode 303 is formed over a substrate 301. Next, a gate insulating layer 305 covering the gate electrode 303 is formed and then a first semiconductor layer 306 is formed.

As the substrate 301, a glass substrate, a ceramic substrate, a plastic substrate which has high heat resistance enough to withstand a process temperature of this manufacturing process, or the like can be used. In the case where the substrate does not need a light-transmitting property, a metal substrate, such as a stainless steel alloy substrate, provided with an insulating layer on its surface may be used. As a glass substrate, for example, an alkali-free glass substrate formed using barium borosilicate glass, aluminoborosilicate glass, aluminosilicate glass, or the like may be used. In addition, as the glass substrate 301, a glass substrate having any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

The gate electrode 303 can be formed with a single layer or a stack using any of metal materials such as molybdenum, titanium, chromium, tantalum, tungsten, aluminum, copper, neodymium, and scandium and an alloy material which contains any of these materials as its main component. Alternatively, a semiconductor layer typified by polycrystalline silicon doped with phosphorus or the like, or an AgPdCu alloy may be used.

As a two-layer structure for the gate electrode 303, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer structure for the gate electrode 303, a layered structure of a tungsten layer or a tungsten nitride layer, a layer of an alloy of aluminum and silicon or an alloy of aluminum and titanium, and a titanium nitride layer or a titanium layer is preferable. When a metal layer functioning as a barrier layer is stacked over a layer with low electric resistance, electric resistance can be low and diffusion of a metal element from the metal layer into the semiconductor layer can be prevented.

In order to improve adhesion between the gate electrode 303 and the substrate 301, a layer of a nitride of any of the aforementioned metal materials may be provided between the substrate 301 and the gate electrode 303.

The gate electrode 303 can be formed as follows: a conductive layer is formed over the substrate 301 with a sputtering method or a vacuum evaporation method, a mask is formed over the conductive layer with a photolithography method, an inkjet method, or the like, and then the conductive layer is etched using the mask. Alternatively, the gate electrode 303 can be formed by discharging a conductive nanopaste of silver, gold, copper, or the like over the substrate with an inkjet method and baking the conductive nanopaste. Here, a conductive layer is formed over the substrate 301 and then etched using a resist mask which is formed through a first photolithography process, so that the gate electrode 303 is formed.

Note that, in the photolithography process, a resist may be formed over the entire surface of the substrate. Alternatively, a resist may be printed with a printing method on a region where a resist mask is to be formed, and then, the resist may be exposed to light, so that a resist can be saved and cost reduction can be achieved. Still alternatively, instead of a light-exposure machine, a laser beam direct drawing apparatus may be used to expose a resist to light.

When the gate electrode 303 has a tapered shape, disconnection of the semiconductor layer and a wiring layer formed over the gate electrode 303 at a step portion can be reduced. In order to form the gate electrode 303 into a tapered shape, etching is performed while a resist mask is being reduced in size.

Through the step of forming the gate electrode 303, a gate wiring (a scan line) and a capacitor wiring can also be formed at the same time. Note that a "scan line" means a wiring which selects a pixel, while a "capacitor wiring" means a wiring which is connected to one of electrodes of a capacitor in a pixel. However, an embodiment of the present invention is not limited thereto and the gate electrode 303 and one of or both the gate wiring and the capacitor wiring may be formed in separate steps.

The gate insulating layer 305 can be formed with a single layer or a stack using any of a silicon oxide layer, a silicon nitride layer, a silicon oxynitride layer, and a silicon nitride oxide layer.

In this specification, silicon oxynitride contains oxygen and nitrogen so that the content of oxygen is higher than that of nitrogen, and in the case where measurements are performed using Rutherford backscattering spectrometry (RBS) and hydrogen forward scattering spectrometry (HFS), silicon oxynitride preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively. Further, silicon nitride oxide contains oxygen and nitrogen so that the content of nitrogen is higher than that of oxygen, and in the case where measurements are performed using RBS and HFS, silicon nitride oxide preferably contains oxygen, nitrogen, silicon, and hydrogen at 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The gate insulating layer 305 is formed with a plasma CVD method using a plasma treatment apparatus described in Embodiment 1, so that the gate insulating layer can have fewer defects. Thus, variation in electric characteristics and degradation of thin film transistors to be formed later can be reduced.

Further, by forming a silicon oxide layer with a CVD method using an organosilane gas as an uppermost surface of the gate insulating layer 305, the crystallinity of the first semiconductor layer which is formed later can be improved, so that an ON current and field-effect mobility of the thin film transistor can be increased. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The first semiconductor layer 306 is formed using a microcrystalline semiconductor layer. As the microcrystalline semiconductor layer, a microcrystalline silicon layer, a microcrystalline silicon germanium layer, a microcrystalline germanium layer, or the like is used, for example. Alternatively, a microcrystalline silicon layer containing phosphorus, arsenic, or antimony, a microcrystalline silicon germanium layer containing phosphorus, arsenic, or antimony, a microcrystalline germanium layer containing phosphorus, arsenic, or antimony, or the like may be used.

A microcrystalline semiconductor included in the microcrystalline semiconductor layer is a semiconductor having a crystal structure (including a single crystal and a polycrystal). A microcrystalline semiconductor is a semiconductor having a third state that is stable in terms of free energy and is a crystalline semiconductor having short-range order and lattice distortion, in which columnar or needle-like crystals having a grain size of from 2 nm to 200 nm, preferably from 10 nm to 80 nm, more preferably from 20 nm to 50 nm have grown in a direction of the normal to the substrate surface. Accordingly, there is a case where crystal grain boundaries are formed at the interface of columnar or needle-like crystals.

Microcrystalline silicon which is a typical example of the microcrystalline semiconductor has a peak of Raman spectrum which is shifted to a lower wave number than 520 cm$^{-1}$ that represents single crystal silicon. That is, the peak of the Raman spectrum of the microcrystalline silicon exists between 520 cm$^{-1}$ which represents single crystal silicon and 480 cm$^{-1}$ which represents amorphous silicon. Note that hydrogen or halogen of at least 1 at. % may be contained to terminate a dangling bond. Moreover, a rare gas element such as helium, argon, krypton, or neon may be contained to further promote lattice distortion, so that stability of the structure of microcrystals is enhanced and a favorable microcrystalline semiconductor can be obtained. The microcrystalline semiconductor is disclosed in, for example, U.S. Pat. No. 4,409,134.

It is preferable that the concentration of oxygen and nitrogen contained in the microcrystalline semiconductor layer measured by secondary ion mass spectrometry be less than $1\times10^{18}$ atoms/cm$^3$ because crystallinity of a microcrystalline semiconductor layer 315a can be improved.

Figure 12B:
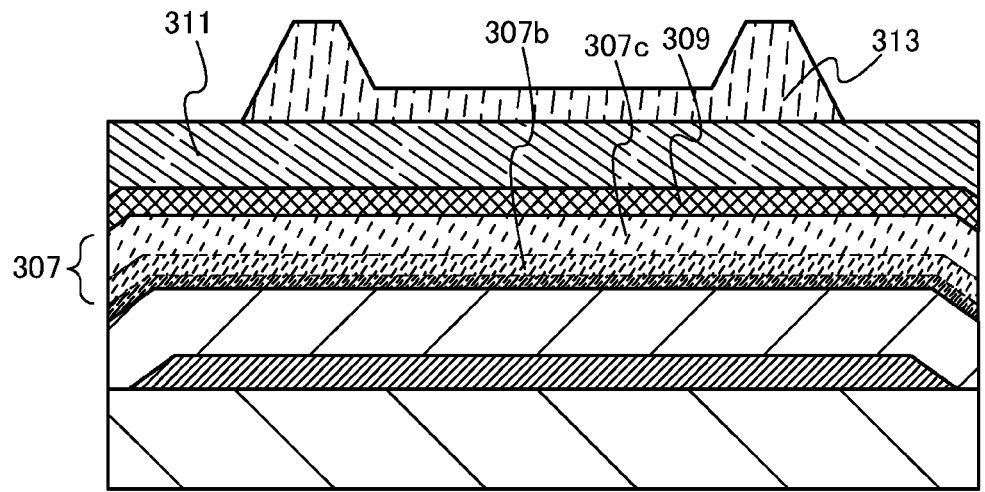
Figure 12C:
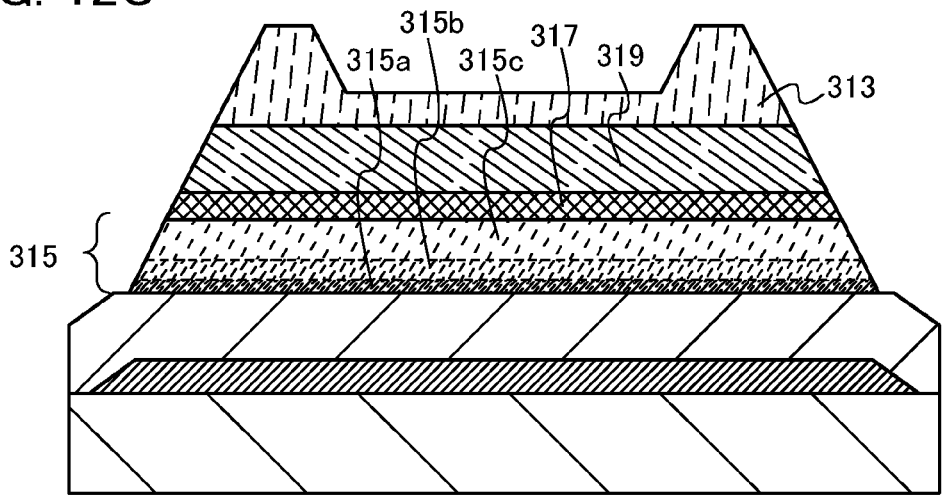

Note that in FIGS. 12A to 12C, the first semiconductor layer 306 having a sheet-like shape is illustrated; however, semiconductor particles may be dispersed over the gate insulating layer 305 instead. When the size of the semiconductor particles is 1 nm to 30 nm and the density of the semiconductor particles is less than $1\times10^{13}$/cm$^2$, preferably less than $1\times10^{10}$/cm$^2$, the semiconductor particles can be formed separately. In that case, a mixed region 307b that is formed later is in contact with the semiconductor particles and the gate insulating layer 305. Alternatively, after forming microcrystalline semiconductor particles for the first semiconductor layer 306 over the gate insulating layer 305, a microcrystalline semiconductor layer may be deposited over the microcrystalline semiconductor particles, whereby the microcrystalline semiconductor layer having high crystallinity even at the interface of the gate insulating layer 305 may be formed.

The thickness of the first semiconductor layer 306 is preferably 3 nm to 100 nm, more preferably 5 nm to 50 nm. This is because when the first semiconductor layer 306 is too thin, an ON current of the thin film transistor is reduced whereas when the first semiconductor layer 306 is too thick, an off current is increased while the thin film transistor is operated at high temperature. The thickness of the first semiconductor layer 306 is set to 3 nm to 100 nm, preferably 5 nm to 50 nm, whereby an on current and an off current of the thin film transistor can be favorable.

The first semiconductor layer 306 is formed by glow discharge plasma using a mixture of a deposition gas containing silicon or germanium and hydrogen in a reaction chamber of the plasma treatment apparatus described in Embodiment 1. Alternatively, the first semiconductor layer 306 is formed by glow discharge plasma using a mixture of a deposition gas containing silicon or germanium, hydrogen, and a rare gas such as helium, argon, neon, krypton, or xenon. Microcrystalline silicon, microcrystalline silicon germanium, microcrystalline germanium, or the like is formed using a mixture which is obtained by diluting the deposition gas containing silicon or germanium with hydrogen whose flow rate is 10 to 2000 times, preferably 10 to 200 times that of the deposition gas. The deposition temperature in that case is preferably a room temperature to 300° C., more preferably, 200° C. to 280° C.

As typical examples of the deposition gas containing silicon or germanium, silane (SiH$_4$), disilane (Si$_2$H$_6$), germane (GeH$_4$), and digermane (Ge$_2$H$_6$) are given.

When the gate insulating layer 305 is formed using a silicon nitride layer, in the case where the first semiconductor layer 306 is a microcrystalline semiconductor layer, an amorphous semiconductor region is likely to be formed at an early stage of deposition, so that crystallinity of the microcrystalline semiconductor layer is low and electric characteristics of the thin film transistor are poor. Therefore, when the gate insulating layer 305 is formed using a silicon nitride layer, a microcrystalline semiconductor layer is preferably deposited under the condition that the dilution rate of the deposition gas containing silicon or germanium is high or under the low temperature condition. For example, the high dilution rate condition is preferable in which the flow rate of hydrogen is 200 to 2000 times, more preferably 250 to 400 times that of the deposition gas containing silicon or germanium. In addition, the low temperature condition is preferable in which the temperature for deposition of the microcrystalline semiconductor layer is 200° C. to 250° C. When the high dilution rate condition or the low temperature condition is employed, early nuclear generation density is increased, an amorphous component over the gate insulating layer is reduced, and crystallinity of the microcrystalline semiconductor layer is improved.

By using a rare gas such as helium, argon, neon, krypton, or xenon as a source gas for the first semiconductor layer 306, the deposition rate of the first semiconductor layer 306 can be increased. When the deposition rate is increased, the amount of impurities mixed into the first semiconductor layer 306 can be reduced, whereby the crystallinity of the first semiconductor layer 306 can be improved. Accordingly, an ON current and field-effect mobility of the thin film transistor are increased and throughput of the thin film transistor can also be increased.

Note that before the first semiconductor layer 306 is formed, impurity elements in the treatment chamber of the CVD apparatus are removed by introducing a deposition gas containing silicon or germanium while exhausting the air in the treatment chamber, so that the amount of the impurity elements in the gate insulating layer 305 and the first semiconductor layer 306 of the thin film transistor, which are formed later, can be reduced, and thus, electric characteristics of the thin film transistor can be improved.

Alternatively, before forming the first semiconductor layer 306, a surface of the gate insulating layer 305 may be exposed to oxygen plasma, hydrogen plasma, or the like.

Next, as illustrated in FIG. 12B, a second semiconductor layer 307 is formed over the first semiconductor layer 306. Here, a mixed region 307b and a region 307c containing an amorphous semiconductor are illustrated as the second semiconductor layer 307. Then, an impurity semiconductor layer 309 and a conductive layer 311 are formed over the second semiconductor layer 307. After that, a resist mask 313 is formed over the conductive layer 311.

The second semiconductor layer 307 including the mixed region 307b and the region 307c containing an amorphous semiconductor can be formed under a condition that a crystal grows partly by using the first semiconductor layer 306 as a seed crystal.

The second semiconductor layer 307 is formed by glow discharge plasma using a mixture of a deposition gas containing silicon or germanium, hydrogen, and a gas containing nitrogen in the treatment chamber of the plasma treatment apparatus described in Embodiment 1. Examples of the gas containing nitrogen include ammonia, nitrogen, nitrogen fluoride, nitrogen chloride, chloroamine, fluoroamine, and the like. Glow discharge plasma can be generated as in the case of the first semiconductor layer 306.

In this case, a flow ratio of the deposition gas containing silicon or germanium to hydrogen is the same as that for forming a microcrystalline semiconductor layer as in the case of forming the first semiconductor layer 306, and a gas containing nitrogen is used for the source gas, whereby crystal growth can be further suppressed compared to the deposition condition of the first semiconductor layer 306. As a result, the mixed region 307b and the region 307c containing an amorphous semiconductor, which is formed with a well-ordered semiconductor layer having fewer defects and a steep tail slope in a level at a band edge in the valence band, can be formed in the second semiconductor layer 307.

Here, a typical example of a condition for forming the second semiconductor layer 307 is as follows. The flow rate of hydrogen is 10 to 2000 times, preferably, 10 to 200 times that of the deposition gas containing silicon or germanium. Note that in a typical example of a condition for forming a normal amorphous semiconductor layer, the flow rate of hydrogen is 0 to 5 times that of the deposition gas containing silicon or germanium.

A rare gas such as helium, neon, argon, krypton, or xenon is introduced into the source gas of the second semiconductor layer 307, whereby the deposition rate of the second semiconductor layer 307 can be increased.

The thickness of the second semiconductor layer 307 is preferably 50 nm to 350 nm, more preferably, 120 nm to 250 nm.

At an early stage of deposition of the second semiconductor layer 307, since a gas containing nitrogen is contained in the source gas, the crystal growth is partly suppressed; therefore, while conical or pyramidal microcrystalline semiconductor regions grow, an amorphous semiconductor region filling a space between the conical or pyramidal microcrystalline semiconductor regions is formed. Such a region where both the microcrystalline semiconductor region and the amorphous semiconductor region exist is referred to as the mixed region 307b. Further, crystal growth of the conical or pyramidal microcrystalline semiconductor region is stopped and thus a microcrystalline semiconductor region is not formed but only an amorphous semiconductor region is formed. Such a region where a microcrystalline semiconductor region is not formed but only an amorphous semiconductor region is formed is referred to as the region 307c containing an amorphous semiconductor. Before the conical or pyramidal microcrystalline semiconductor region grows, a microcrystalline semiconductor layer is deposited over the entire surface of the first semiconductor layer 306 using the first semiconductor layer 306 as a seed crystal in some cases.

Here, a gas containing nitrogen is contained in the source gas of the second semiconductor layer 307 and the second semiconductor layer 307 including the mixed region 307b and the region 307c containing an amorphous semiconductor is formed; however, another method for forming the second semiconductor layer 307 may be used in which a surface of the first semiconductor layer 306 is exposed to a gas containing nitrogen so that nitrogen is adsorbed to the surface of the first semiconductor layer 306 and then the second semiconductor layer 307 including the mixed region 307b and the region 307c containing an amorphous semiconductor is formed using a deposition gas containing silicon or germanium and hydrogen for the source gas.

The impurity semiconductor layer 309 is formed by glow discharge plasma using a mixture of a deposition gas containing silicon, hydrogen, and phosphine (diluted with hydrogen or silane) in the reaction chamber of the plasma treatment apparatus. Amorphous silicon to which phosphorus is added or microcrystalline silicon to which phosphorus is added is formed by using the deposition gas containing silicon which is diluted with hydrogen. In the case of manufacturing a p-channel thin film transistor, the impurity semiconductor layer 309 may be formed by glow discharge plasma using diborane instead of phosphine.

The conductive layer 311 can be formed with a single layer or a stack using any of aluminum, copper, titanium, neodymium, scandium, molybdenum, chromium, tantalum, tungsten, and the like. The conductive layer 311 may be formed using an aluminum alloy to which an element to prevent a hillock is added (an aluminum-neodymium alloy or the like which can be used for the gate electrode 303). The conductive layer 311 may have a layered structure where a layer in contact with an impurity semiconductor layer 309 is formed using titanium, tantalum, molybdenum, tungsten, or nitride of any of these elements, and aluminum or an aluminum alloy is formed thereover. Furthermore, a layered structure may be employed in which upper and lower surfaces of aluminum or an aluminum alloy may each be covered with titanium, tantalum, molybdenum, tungsten, or nitride of any of these elements.

The conductive layer 311 is formed with a CVD method, a sputtering method, or a vacuum evaporation method. Alternatively, the conductive layer 311 may be formed by discharging a conductive nanopaste of silver, gold, copper, or the like by a screen printing method, an ink-jet method, or the like and baking the conductive nanopaste.

The resist mask 313 is formed through a second photolithography process. The resist mask 313 has regions with different thicknesses. Such a resist mask can be formed using a multi-tone mask. The multi-tone mask is preferably used because the number of photomasks used and the number of manufacturing steps can be reduced. In this embodiment, the multi-tone mask can be used in a step of forming patterns of the first semiconductor layer 306 and the second semiconductor layer 307 and a step of forming a source region and a drain region.

A multi-tone mask is a mask capable of light exposure with multi-level light quantity; for example, light exposure is performed with three levels of light quantity to provide an exposed region, a half-exposed region, and an unexposed region. By one light exposure and development step with the use of a multi-tone mask, a resist mask with plural thicknesses (typically, two kinds of thicknesses) can be formed. Therefore, with the use of a multi-tone mask, the number of photomasks can be reduced.

Next, with the use of the resist mask 313, the first semiconductor layer 306, the second semiconductor layer 307, the impurity semiconductor layer 309, and the conductive layer 311 are etched. Through this step, the first semiconductor layer 306, the second semiconductor layer 307, the impurity semiconductor layer 309, and the conductive layer 311 are separated for each element, to form a third semiconductor layer 315, an impurity semiconductor layer 317, and a conductive layer 319. Note that the third semiconductor layer 315 includes a microcrystalline semiconductor layer 315a obtained by etching the first semiconductor layer 306, a mixed layer 315b obtained by etching the mixed region 307b of the second semiconductor layer 307, and a region 315c containing an amorphous semiconductor, which is obtained by etching the region 307c containing an amorphous semiconductor of the second semiconductor layer 307 (FIG. 12C).

Next, the resist mask 313 is reduced in size to form a separated resist mask 323. Ashing using oxygen plasma may be performed in order that the resist mask is reduced in its size. Here, ashing is performed on the resist mask 313 so that the resist mask 313 is separated over the gate electrode. Accordingly, the resist mask 323 can be formed (see FIG. 13A).

Figure 13A:
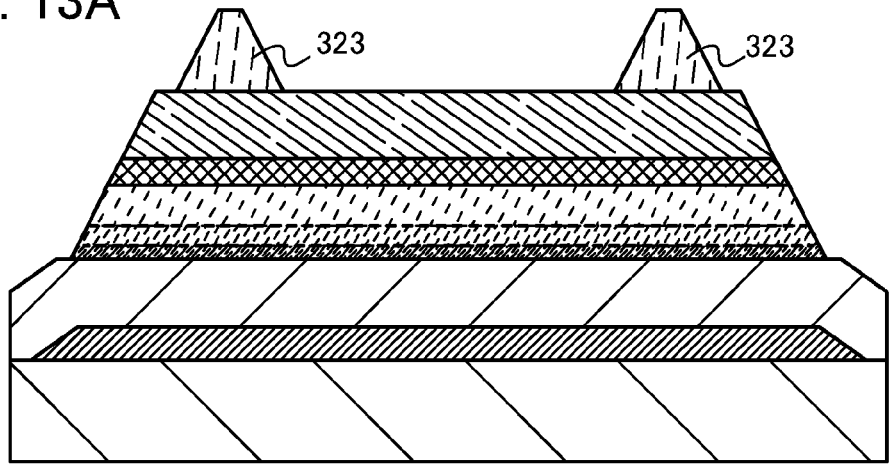
FIGS. 13A to 13C illustrate the example of the method for manufacturing a thin film transistor.
Figure 13B:
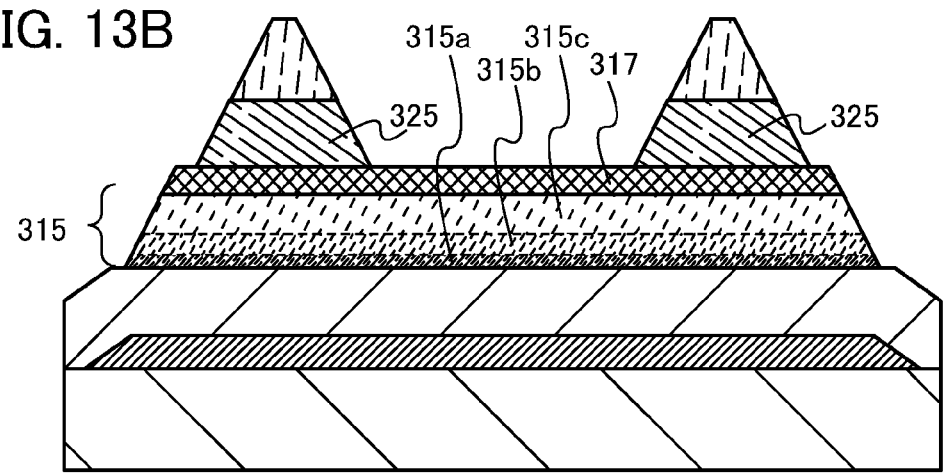
Figure 13C:
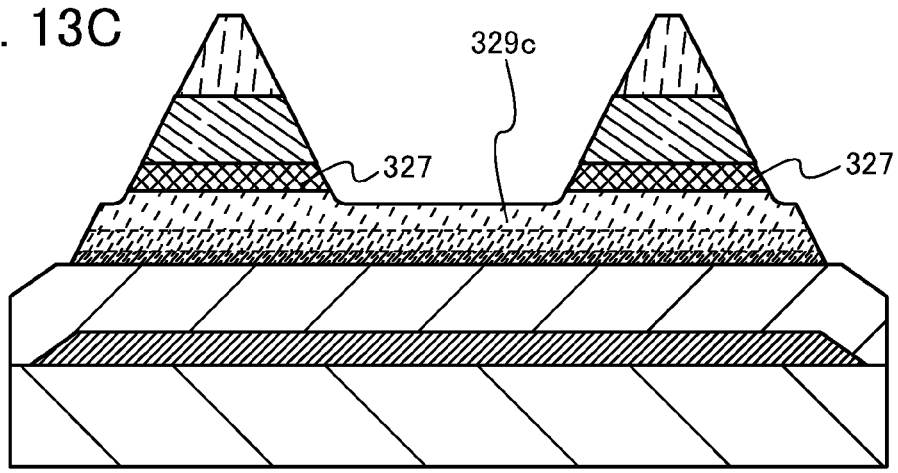

Next, the conductive layer 319 is etched using the resist mask 323, whereby wirings 325 serving as source and drain electrodes are formed (see FIG. 13B). Here, dry etching is employed. The wirings 325 serve not only as source and drain electrodes but also as signal lines. However, an embodiment of the present invention is not limited to this, and a signal line may be provided separately from the source and drain electrodes.

Next, with the use of the resist mask 323, the region 315c containing an amorphous semiconductor of the third semiconductor layer 315 and the impurity semiconductor layer 317 are each partly etched. Here, dry etching is employed. Through the above steps, a region 329c containing an amorphous semiconductor which has a depression on its surface and the impurity semiconductor layers 327 serving as source and drain regions are formed (see FIG. 13C). After that, the resist mask 323 is removed.

Here, the conductive layer 319, the region 315c containing an amorphous semiconductor, and the impurity semiconductor layer 317 are each partly subjected to dry etching. Accordingly, the conductive layer 319 is anisotropically etched and thus, the side surfaces of the wirings 325 are substantially aligned with the side surfaces of the impurity semiconductor layers 327.

Alternatively, the impurity semiconductor layer 317 and the region 315c containing an amorphous semiconductor may be partly etched after removal of the resist mask 323. By the etching, the impurity semiconductor layer 317 is etched using the wirings 325 as masks, so that the side surfaces of the wirings 325 are substantially aligned with the side surfaces of the impurity semiconductor layers 327.

Note that the conductive layer 319 may be subjected to wet etching and the region 315c containing an amorphous semiconductor and the impurity semiconductor layer 317 may be subjected to dry etching. With wet etching, the conductive layer 319 is isotropically etched, so that the wirings 325 each of which is on an inner side than the resist mask 323 is formed. Then, a shape is formed in which side surfaces of the impurity semiconductor layer 327 are on outer sides than side surface of the wiring 325.

Next, dry etching may be performed after removal of the resist mask 323. A condition of dry etching is set so that a surface of an exposed portion of the region 329c containing an amorphous semiconductor is not damaged and the etching rate with respect to the region 329c containing an amorphous semiconductor layer is low. In other words, a condition which gives almost no damages to the exposed surface of the region 329c containing an amorphous semiconductor and hardly reduces the thickness of the exposed portion of the region 329c containing an amorphous semiconductor is applied. As an etching gas, $Cl_2$, $CF_4$, $N_2$, or the like is used. There is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Next, the surface of the region 329c containing an amorphous semiconductor may be subjected to plasma treatment typified by water plasma treatment, ammonia plasma treatment, nitrogen plasma treatment, or the like.

The water plasma treatment can be performed by generating plasma using a gas containing water vapor as its main component, which is introduced into the reaction space.

As described above, after formation of the impurity semiconductor layers 327, dry etching is further performed under such a condition that the region 329c containing an amorphous semiconductor is not damaged, whereby an impurity such as a residue existing on the surface of the exposed portion of the region 329c containing an amorphous semiconductor can be removed. Further, by the plasma treatment, insulation between the source region and the drain region can be ensured, and thus, in a thin film transistor which is completed, off current can be reduced, and variation in electric characteristics can be reduced.

Through these steps, a thin film transistor including a gate insulating layer having fewer defects can be manufactured using the small number of masks with high productivity. Further, a thin film transistor whose electric characteristics are less likely to vary and be degraded can be manufactured with high productivity. Note that an inverted staggered thin film transistor is used in this embodiment; however, a thin film transistor having a top-gate structure can be applied as appropriate.

Embodiment 4

The thin film transistor described in Embodiment 3 can be applied to a variety of electronic appliances (including an amusement machine). Examples of electronic appliances are a television set (also referred to as a television or a television receiver), a monitor of a computer, electronic paper, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

The thin film transistor described in Embodiment 3 can be applied to, for example, electronic paper. Electronic paper can be used for electronic appliances of a variety of fields as long as they can display data. For example, electronic paper can be applied to an electronic book (e-book), a poster, a transportation advertisement in a vehicle such as a train, displays of various cards such as a credit card, and the like. Examples of the electronic appliances are illustrated in FIGS. 14A to 14D.

Figure 14A:
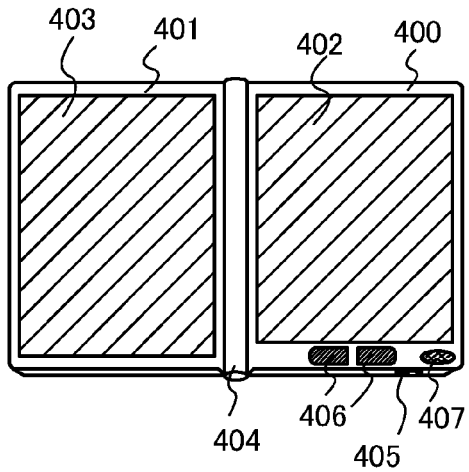
FIGS. 14A to 14D illustrate electronic appliances.

FIG. 14A illustrates an example of an electronic book. The electronic book illustrated in FIG. 14A includes a housing 400 and a housing 401. The housing 400 and the housing 401 are combined with a hinge 404 so that the electronic book can be opened and closed. With such a structure, the electronic book can be operated like a paper book.

A display portion 402 and a display portion 403 are incorporated in the housing 400 and the housing 401, respectively. The display portion 402 and the display portion 403 may display one image or different images. In the case where the display portion 402 and the display portion 403 display different images, for example, a display portion on the right side (the display portion 402 in FIG. 14A) can display text and a display portion on the left side (the display portion 403 in FIG. 14A) can display graphics. Display devices each formed using the thin film transistor described in Embodiment 3 can be applied to the display portion 402 and the display portion 403.

FIG. 14A illustrates an example in which the housing 400 is provided with an operation portion and the like. For example, the housing 400 is provided with a power input terminal 405, an operation key 406, a speaker 407, and the like. The operation key 406 can have, for example, a function of turning pages. Note that a keyboard, a pointing device, and the like may be provided on the surface of the housing, on which the display portion of the housing is provided. Further, an external connection terminal (an earphone terminal, a USB terminal, a terminal that can be connected to various cables such as a USB cable, or the like), a recording medium insertion portion, and the like may be provided on the back surface or the side surface of the housing. Further, the electronic book illustrated in FIG. 14A may have a function of an electronic dictionary.

The electronic book illustrated in FIG. 14A may transmit and receive data wirelessly. The structure may be employed in which a desired book data or the like is purchased and downloaded from an electronic book server wirelessly.

Figure 14B:
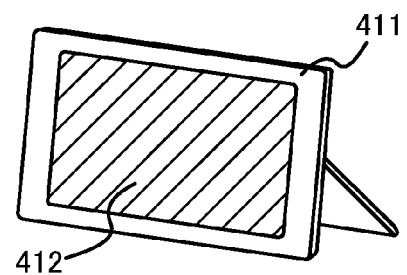

FIG. 14B illustrates an example of a digital photo frame. For example, in the digital photo frame illustrated in FIG. 14B, a display portion 412 is incorporated in a housing 411. The display portion 412 can display various images. For example, the display portion 412 can display data of an image shot by a digital camera or the like, so that the digital photo frame can function like a normal photo frame. A display device formed using the thin film transistor described in Embodiment 3 can be applied to the display portion 412.

Note that the digital photo frame illustrated in FIG. 14B is provided with an operation portion, an external connection terminal (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame. For example, a memory storing data of an image shot by a digital camera is inserted in the recording medium insertion portion of the digital photo frame, whereby the image data can be transferred and displayed on the display portion 412.

The digital photo frame illustrated in FIG. 14B may transmit and receive data wirelessly. The structure may be employed in which desired image data is transferred wirelessly to be displayed.

Figure 14C:
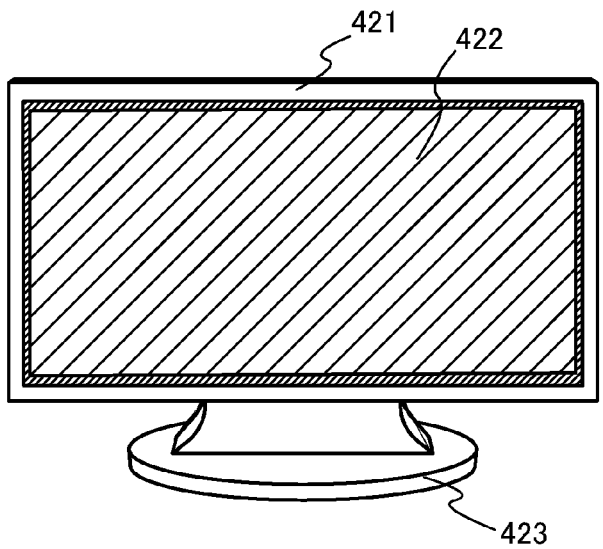

FIG. 14C illustrates an example of a television set. In the television set illustrated in FIG. 14C, a display portion 422 is incorporated in a housing 421. The display portion 422 can display an image. The housing 421 is supported by a stand 423 here. A display device formed using the thin film transistor described in Embodiment 3 can be applied to the display portion 422.

The television set illustrated in FIG. 14C can be operated by an operation switch of the housing 421 or a separate remote controller. Channels and volume can be controlled by an operation key of the remote controller so that an image displayed on the display portion 422 can be controlled. Further, the remote controller may be provided with a display portion for displaying data output from the remote controller.

Note that the television set illustrated in FIG. 14C is provided with a receiver, a modem, and the like. With the receiver, a general television broadcast can be received. Further, when the television set is connected to a communication network by wired or wireless connection via the modem, one-way (from a transmitter to a receiver) or two-way (between a transmitter and a receiver or between receivers) data communication can be performed.

Figure 14D:
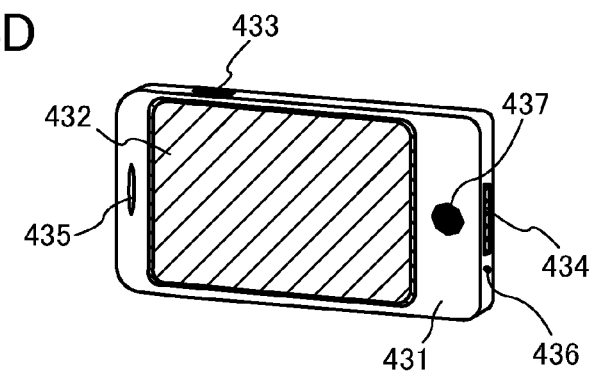

FIG. 14D illustrates an example of a mobile phone handset. The mobile phone handset illustrated in FIG. 14D is provided with a display portion 432 incorporated in a housing 431, an operation button 433, an operation button 437, an external connection port 434, a speaker 435, a microphone 436, and the like. A display device formed using the thin film transistor described in Embodiment 3 can be applied to the display portion 432.

The display portion 432 of the mobile phone handset illustrated in FIG. 14D may be a touch panel. When the display portion 432 is touched with a finger or the like, contents displayed on the display portion 432 can be controlled. In that case, operations such as making calls and composing mails can be performed by touching the display portion 432 with a finger or the like.

There are mainly three screen modes of the display portion 432. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 432 so that text displayed on a screen can be input. In that case, it is preferable to display a keyboard or number buttons on almost all area of the screen of the display portion 432.

When a detection device including a sensor for detecting inclination, such as a gyroscope or an acceleration sensor, is provided inside the mobile phone handset illustrated in FIG. 14D, display in the screen of the display portion 432 can be automatically switched by determining the direction of the mobile phone handset (whether the mobile phone handset is placed horizontally or vertically for a landscape mode or a portrait mode).

The screen modes are switched by touching the display portion 432 or operating the operation button 437 of the housing 431. Alternatively, the screen modes may be switched depending on the kind of the image displayed on the display portion 432. For example, when a signal of an image displayed on the display portion is the one of moving image data, the screen mode is switched to the display mode. When the signal is the one of text data, the screen mode is switched to the input mode.

Further, in the input mode, when input by touching the display portion 432 is not performed for a certain period while a signal detected by the optical sensor in the display portion 432 is detected, the screen mode may be controlled so as to be switched from the input mode to the display mode.

The display portion 432 may function as an image sensor. For example, an image of the palm print, the fingerprint, or the like is taken by touching the display portion 432 with the palm or the finger, whereby personal authentication can be performed. Further, by providing a backlight or sensing light source emitting a near-infrared light for the display portion, an image of a finger vein, a palm vein, or the like can be taken.

As described above, a thin film transistor and a display device which are embodiments of the present invention can be applied to various electronic appliances.

This application is based on Japanese Patent Application serial no. 2009-146926 filed with Japan Patent Office on Jun. 19, 2009, the entire contents of which are hereby incorporated by reference.

What is claimed is:

1. A method for forming a film in a plasma treatment apparatus comprising, in a reaction chamber, a first electrode configured so that a substrate is placed thereon; and a second electrode facing the first electrode, the second electrode comprising protruding portions on a surface of the second electrode opposite to the first electrode wherein the second electrode comprises first gas introduction ports in top surfaces of the protruding portions and second gas introduction ports between the protruding portions; the method comprising the steps of:
    supplying power to a high-frequency power source while a reactive gas is introduced in the reaction chamber from the first gas introduction ports and a deposition gas is introduced in the reaction chamber from the second gas introduction ports;
    generating bulk plasma with an electron density which is higher directly under the protruding portions of the second electrode than on a periphery of side surfaces of the protruding portions; and
    forming the film over the substrate.

2. The method for forming a film in a plasma treatment apparatus according to claim 1,
    wherein the reactive gas is a nitriding gas, an oxidizing gas, or a hydrogen gas, and
    wherein the deposition gas contains silicon or germanium.

3. The method for forming a film in a plasma treatment apparatus according to claim 1, the plasma treatment apparatus further comprising a first diffusing plate and a second diffusing plate in the second electrode,
    wherein the reactive gas introduced from the first gas introduction ports is diffused by the first diffusing plate and the deposition gas introduced from the second gas introduction ports is diffused by the second diffusing plate in the second electrode.

4. The method for forming a film in a plasma treatment apparatus according to claim 1, further comprising the step of producing a glow discharge plasma in the reaction chamber by supplying high-frequency power to the second electrode,
    wherein an electron density of the glow discharge plasma generated over the protruding portions is higher than an electron density of the glow discharge plasma generated between the protruding portions when the high-frequency power is supplied to the second electrode.

5. A method for forming a film in a plasma treatment apparatus comprising, in a reaction chamber, a first electrode configured so that a substrate is placed thereon; and a second electrode facing the first electrode, the second electrode comprising protruding portions on a surface of the second electrode opposite to the first electrode wherein the second electrode comprises first gas introduction ports in top surfaces of the protruding portions and second gas introduction ports between the protruding portions; the method comprising the steps of:
    supplying power to a high-frequency power source while a reactive gas is introduced in the reaction chamber from the first gas introduction ports and a deposition gas is introduced in the reaction chamber from the second gas introduction ports;
    generating a sheath with a thickness which is larger or equal to a height of the protruding portions, directly under the second gas introduction ports; and
    forming the film over the substrate.

6. The method for forming a film in a plasma treatment apparatus according to claim 5,
    wherein the reactive gas is a nitriding gas, an oxidizing gas, or a hydrogen gas, and
    wherein the deposition gas contains silicon or germanium.

7. The method for forming a film in a plasma treatment apparatus according to claim 5, the plasma treatment apparatus further comprising a first diffusing plate and a second diffusing plate in the second electrode,
    wherein the reactive gas introduced from the first gas introduction ports is diffused by the first diffusing plate and the deposition gas introduced from the second gas introduction ports is diffused by the second diffusing plate in the second electrode.

8. The method for forming a film in a plasma treatment apparatus according to claim 5, further comprising the step of producing a glow discharge plasma in the reaction chamber by supplying high-frequency power to the second electrode,
    wherein an electron density of the glow discharge plasma generated over the protruding portions is higher than an electron density of the glow discharge plasma generated between the protruding portions when the high-frequency power is supplied to the second electrode.

9. The method for forming a film in a plasma treatment apparatus according to claim 5, further comprising the step of producing a glow discharge plasma in the reaction chamber by supplying high-frequency power to the second electrode,
    wherein a distance between two of the protruding portions of the second electrode adjacent to each other is smaller than twice the thickness of the sheath generated between the protruding portions of the second electrode due to the glow discharge plasma when the high-frequency power is supplied to the second electrode.

10. The method for forming a film in a plasma treatment apparatus according to claim 5, further comprising the step of producing a glow discharge plasma in the reaction chamber by supplying high-frequency power to the second electrode,
    wherein the height of the protruding portions of the second electrode is smaller than the thickness of the sheath generated between the protruding portions of the second electrode due to the glow discharge plasma when the high-frequency power is supplied to the second electrode.

11. A method for forming a film in a plasma treatment apparatus comprising, in a reaction chamber, a first electrode configured so that a substrate is placed thereon; and a second electrode facing the first electrode, the second electrode comprising protruding portions on a surface of the second electrode opposite to the first electrode wherein the second electrode comprises first gas introduction ports provided in top surfaces of the protruding portions and second gas introduction ports provided between the protruding portions; the method comprising the steps of:
    supplying power to a high-frequency power source while a reactive gas is introduced in the reaction chamber from the first gas introduction ports and a deposition gas is introduced in the reaction chamber from the second gas introduction ports;
    generating a sheath with a thickness which is larger or equal to a height of the protruding portions, directly under the second gas introduction ports;
    generating bulk plasma with an electron density which is higher directly under the protruding portions of the second electrode than on a periphery of side surfaces of the protruding portions; and
    forming the film over the substrate.

12. The method for forming a film in a plasma treatment apparatus according to claim 11,
   wherein the reactive gas is a nitriding gas, an oxidizing gas, or a hydrogen gas, and
   wherein the deposition gas contains silicon or germanium.

13. The method for forming a film in a plasma treatment apparatus according to claim 11, the plasma treatment apparatus further comprising a first diffusing plate and a second diffusing plate in the second electrode,
   wherein the reactive gas introduced from the first gas introduction ports is diffused by the first diffusing plate and the deposition gas introduced from the second gas introduction ports is diffused by the second diffusing plate in the second electrode.

14. The method for forming a film in a plasma treatment apparatus according to claim 11, further comprising the step of producing a glow discharge plasma in the reaction chamber by supplying high-frequency power to the second electrode,
   wherein an electron density of the glow discharge plasma generated over the protruding portions is higher than an electron density of the glow discharge plasma generated between the protruding portions when the high-frequency power is supplied to the second electrode.

15. The method for forming a film in a plasma treatment apparatus according to claim 11, further comprising the step of producing a glow discharge plasma in the reaction chamber by supplying high-frequency power to the second electrode,
   wherein a distance between two of the protruding portions of the second electrode adjacent to each other is smaller than twice the thickness of the sheath generated between the protruding portions of the second electrode due to the glow discharge plasma when the high-frequency power is supplied to the second electrode.

16. The method for forming a film in a plasma treatment apparatus according to claim 11, further comprising the step of producing a glow discharge plasma in the reaction chamber by supplying high-frequency power to the second electrode,
   wherein the height of the protruding portions of the second electrode is smaller than the thickness of the sheath generated between the plurality of protruding portions of the second electrode due to the glow discharge plasma when the high-frequency power is supplied to the second electrode.

* * * * *

UNITED STATES PATENT AND TRADEMARK OFFICE
CERTIFICATE OF CORRECTION

PATENT NO.         : 8,951,894 B2
APPLICATION NO.    : 13/618472
DATED              : February 10, 2015
INVENTOR(S)        : Shunpei Yamazaki et al.

Page 1 of 1

It is certified that error appears in the above-identified patent and that said Letters Patent is hereby corrected as shown below:

On the Title Page of the patent, under FOREIGN PATENT DOCUMENTS, please add the following references:

--JP 2000-269201 9/2000--;

--JP 2004-200345 7/2004--;

--JP 2008-211243 A 9/2008--;

--JP 2006-237490 A 9/2006--;

IN THE CLAIMS

In claim 16, at column 26, line 17, "between the plurality of protruding portions" should be --between the protruding portions--.

Signed and Sealed this
Second Day of February, 2016

Michelle K. Lee
*Director of the United States Patent and Trademark Office*